United States Patent
Costanzo et al.

(10) Patent No.: US 7,863,376 B2
(45) Date of Patent: Jan. 4, 2011

(54) THERMALLY CONTROLLED PARTICULATE CORE MIGRATION WITHIN POLYMER MATRIX

(75) Inventors: Philip J. Costanzo, Silver Spring, MD (US); Frederick L. Beyer, Rising Sun, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 804 days.

(21) Appl. No.: 11/717,069

(22) Filed: Mar. 13, 2007

(65) Prior Publication Data

US 2008/0226995 A1    Sep. 18, 2008

(51) Int. Cl.
*C08F 290/14*    (2006.01)
*C04B 24/38*    (2006.01)

(52) U.S. Cl. .................... 525/50; 525/54.1; 524/17; 524/56; 524/552

(58) Field of Classification Search ............ 523/210, 523/180; 524/17, 56, 58, 552; 525/50, 54.1; 526/262; 430/8
See application file for complete search history.

(56) References Cited

U.S. PATENT DOCUMENTS

| | | | |
|---|---|---|---|
| 5,189,055 | A | 2/1993 | Thal et al. |
| 5,938,934 | A | 8/1999 | Balogh et al. |
| 6,664,315 | B2 | 12/2003 | Tomalia et al. |
| 6,855,773 | B1 | 2/2005 | Jensen et al. |
| 7,030,167 | B2 | 4/2006 | Gunther |
| 2003/0065206 | A1 | 4/2003 | Bolskar et al. |
| 2006/0292174 | A1 | 12/2006 | de los Rios et al. |

OTHER PUBLICATIONS

STIC search.*
"Diels-Alder Reaction." Organic Chemistry Portal. www.organic-chemistry.org, 2002.*
"Pressure-Dependence of the Flory-Huggins Interaction Parameter in Polymer Blends." Macromolecules 1993, 26, 5587-5591.*
McElhanon et al. Removable Foams Based on an Epoxy Resin Incorporating Reversible Diels-Alder Adducts. Journal of Applied Polymer Science 85:1496-1502 (2002).
O'Rourke-Muisener et al. Optimal Chain Architectures for the Molecular Design of Functional Polymer Surfaces. Macromolecules 36:771-781 (2003).
O'Rourke Muisener et a . e surement and Modeling of End Group Concentration Depth Profiles for w-Fluorosilane Polystyrene and Its Blends. Macromolecules: 36:2956-2966 (2003).
Costanzo et al. Controlling Dispersion and Migration of Particulate Additives with Block Copolymers and Diels-Alder Chemistry. American Chemical Society (2006).

* cited by examiner

*Primary Examiner*—Vasu Jagannathan
*Assistant Examiner*—Hannah Pak
(74) *Attorney, Agent, or Firm*—William V. Adams; Christos S. Kyriskou

(57) ABSTRACT

A composition is provided that includes a polymer matrix. A core having a core surface is embedded within the polymer matrix. A polymeric ligand passivates the core surface and has a moiety Y, where Y is a Diels-Alder group of a diene or dienophile. A polymeric linker has a complementary Diels-Alder group diene or dienophile to moiety Y and forms a Diels-Alder bond with the moiety Y. A composition is also provided that includes polymer matrix having a matrix surface. A core having a core surface is present on the matrix surface. A polymeric ligand passivates the core surface and has a moiety Y, where Y is Diels-Alder group of a diene or dienophile. The polymer matrix and polymeric ligand together define a matrix-ligand Flory-Huggins binary interaction function greater than 0.

15 Claims, 16 Drawing Sheets

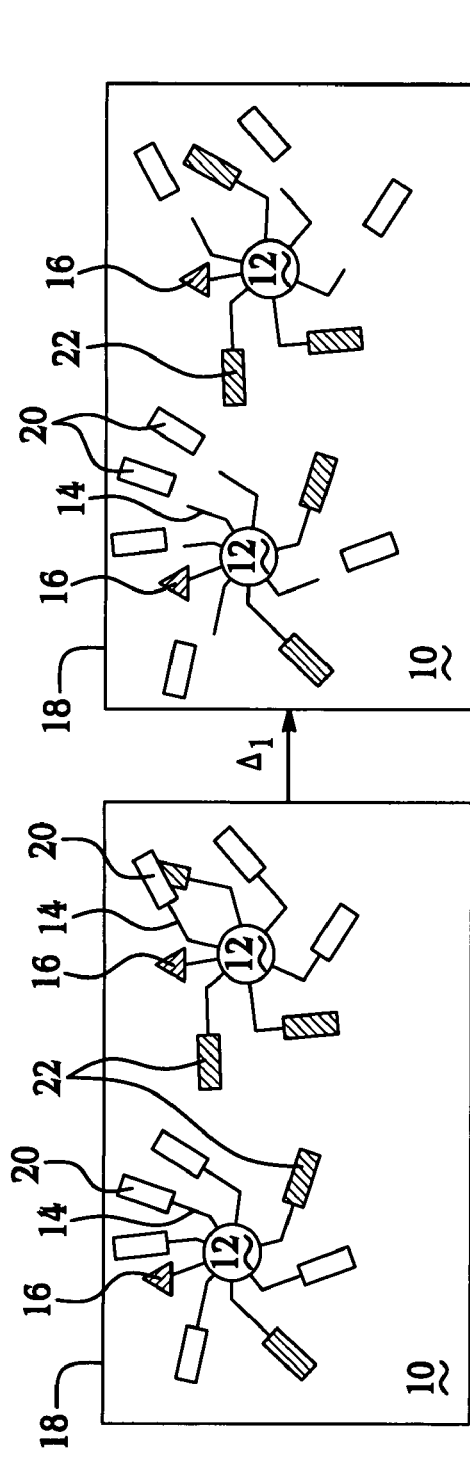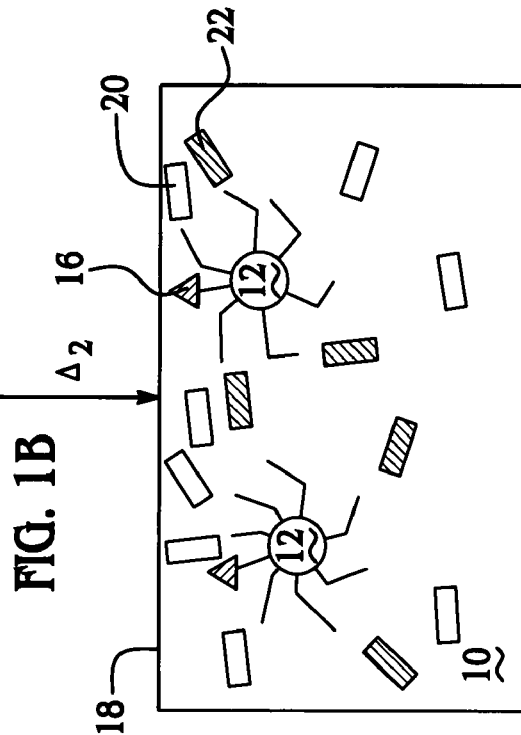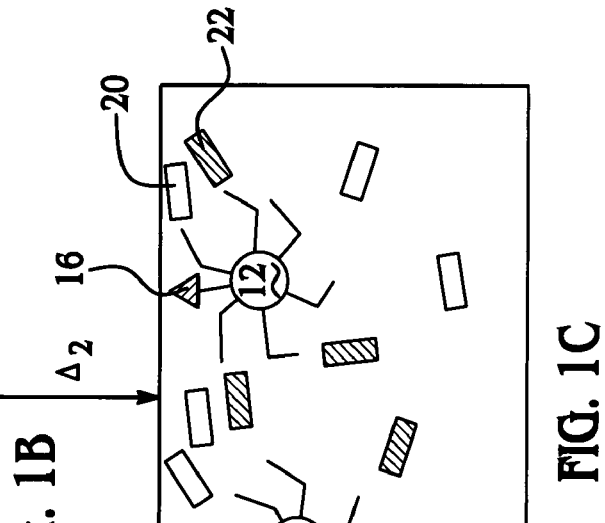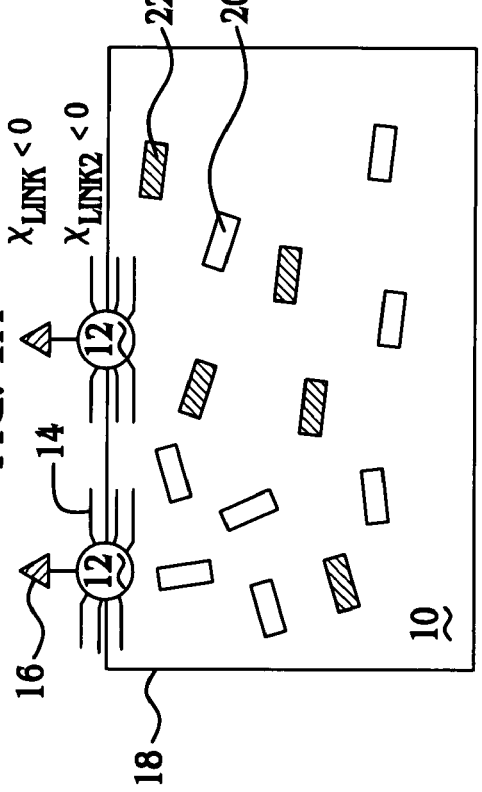

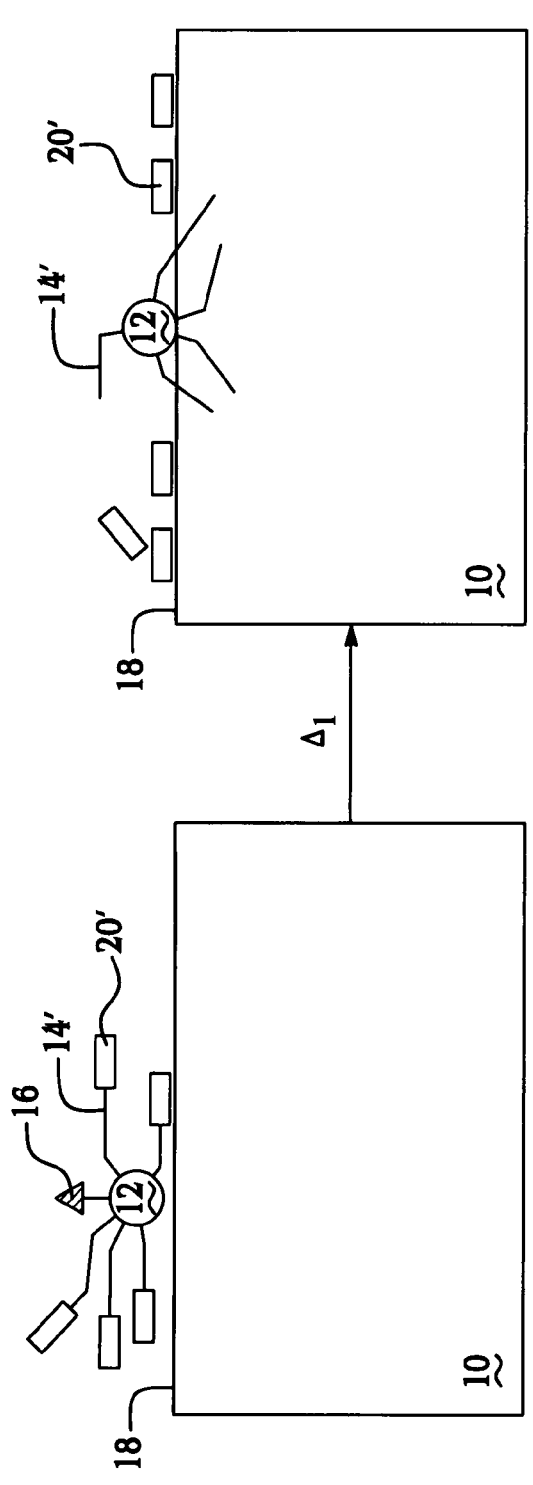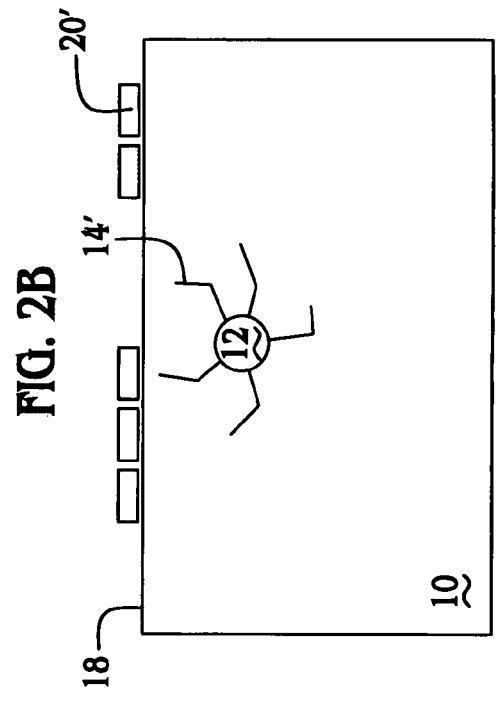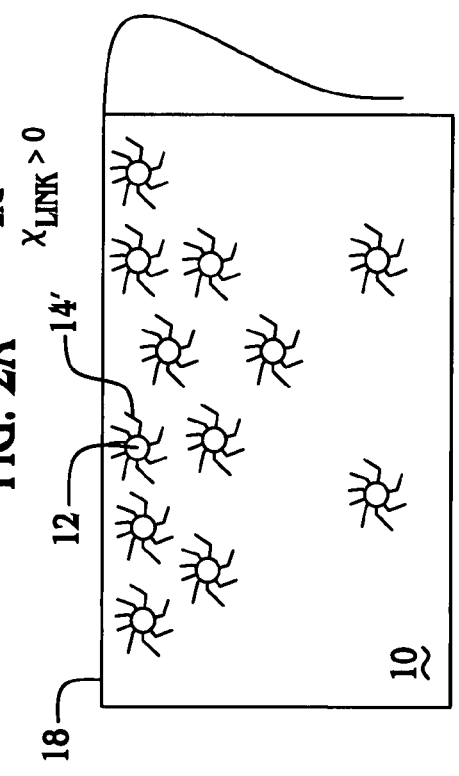
FIG. 2A  FIG. 2B  FIG. 2C  FIG. 2D

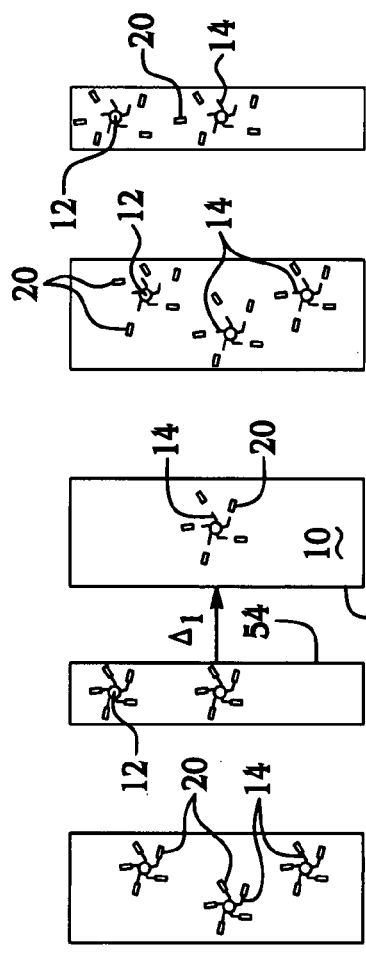
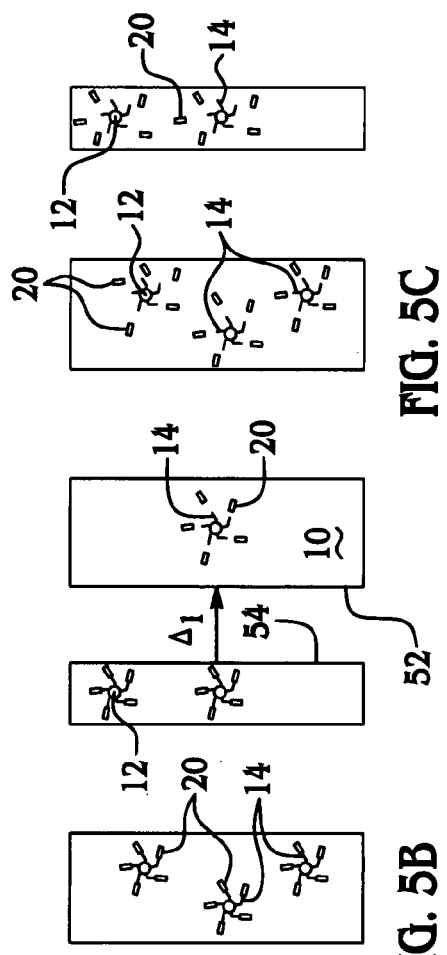
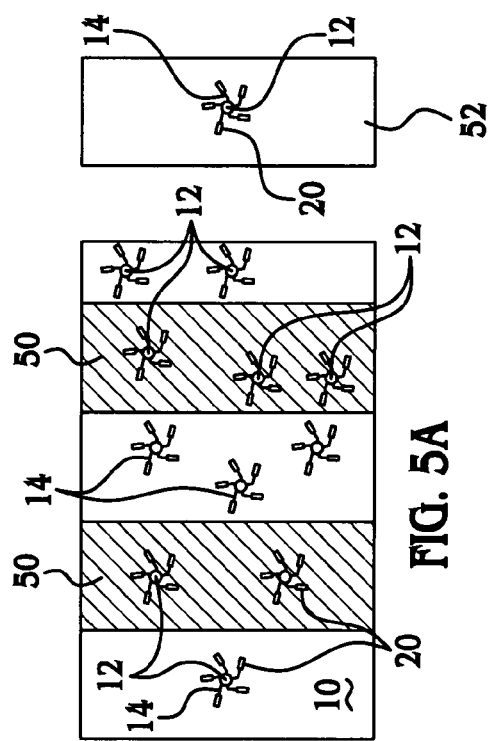
FIG. 5C
FIG. 5B
FIG. 5A
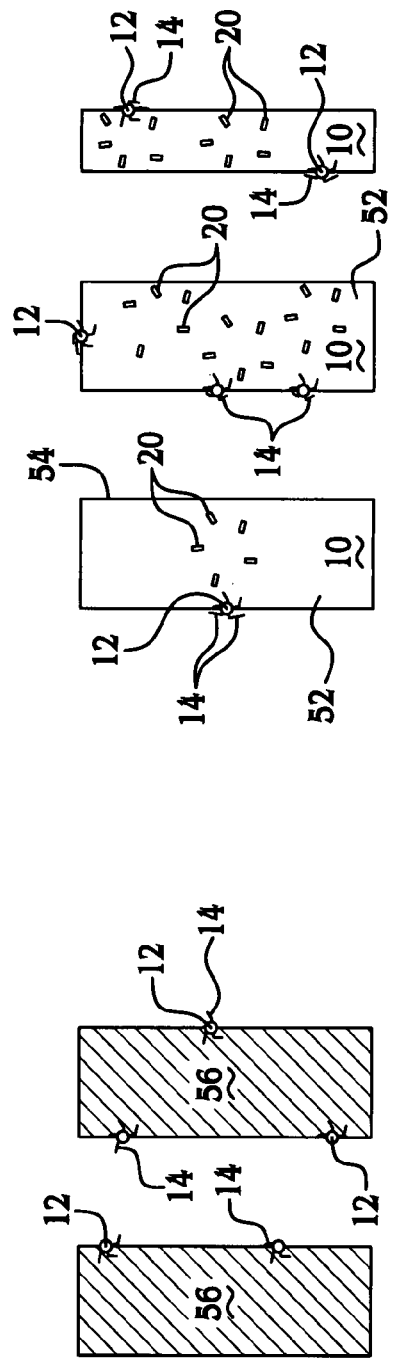
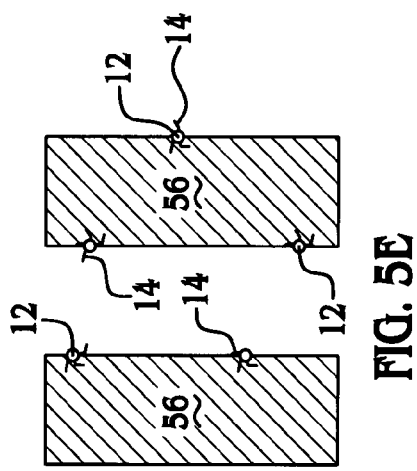
FIG. 5D
FIG. 5E

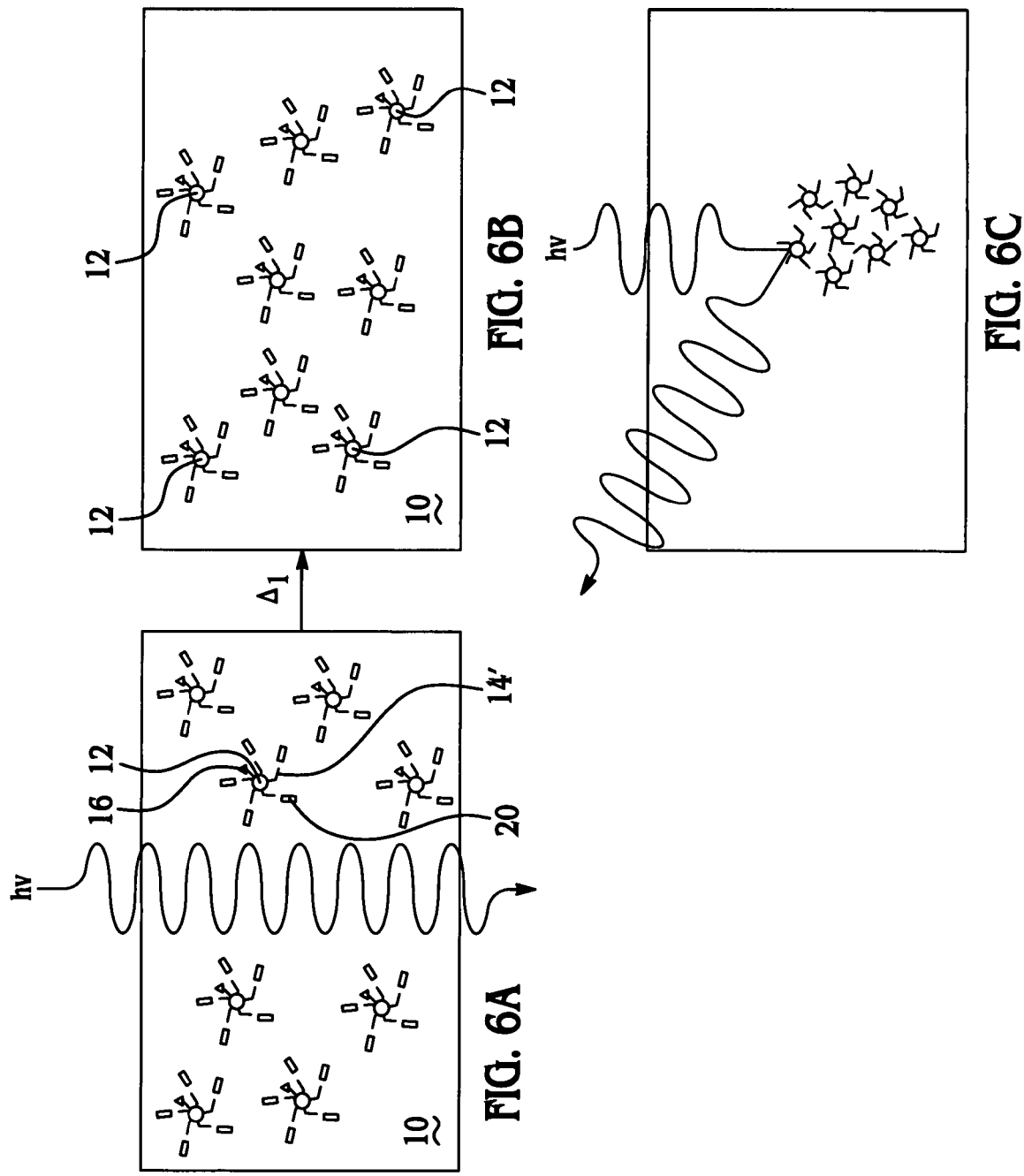

THERMALLY CONTROLLED PARTICULATE CORE MIGRATION WITHIN POLYMER MATRIX

GOVERNMENT INTEREST

The invention described herein may be manufactured, used, and licensed by or for the United States Government.

FIELD OF THE INVENTION

The present invention in general relates to a polymer matrix containing a core composition passivated with a ligand that is bound in a thermally reversible manner to a linker molecule, and in particular to a core that changes miscibility in the matrix based on whether the linker is bound to the ligand.

BACKGROUND OF THE INVENTION

The development of stimuli responsive films and surfaces has been explored and studied for many applications including tissue engineering (1, 2), permeable membranes (3), and packaging materials (4). These materials usually undergo some significant change in their physical properties due to a global stimulus, such as temperature, pH, or light.

By carefully choosing the additive, one can selectively manipulate specific physical properties including impact strength, magnetic, electronic, and optical properties, and conductivity.

Through deliberate materials design and engineering, these changes in physical properties can be used to engineer a specific response to a specific trigger, allowing the design of devices or systems which respond in a useful manner to changes in their environments, without monitoring or activation.

For example, by controlling the composition and molecular weight of core@shell polymer nanoparticles, one can manipulate processing parameters for thermoplastic elastomers (5). Controlling the addition and dispersion of $CaCO_3$, nanoparticles within PMMA matrices results in abrasion resistant polymer coatings (6). Alumina and silica particles have commonly been utilized to manipulate tensile strength, glass transition temperatures, and impact strength (7-10). Additionally, various computer simulations have been employed to predict not only additive location, but the potential impact upon physical property characteristics (11-14).

A wide range of techniques have been utilized to study and prepare phase segregated polymer surfaces (5-17). Koberstein et al. have prepared a variety of systems showing microphase separation of block copolymers, driven by the immiscibility of the component blocks and focusing on the effects of variations in polymer architecture and composition (28, 29). Koberstein et al. demonstrated the mobilization, also referred to as "blooming", of chain-end fluorinated polystyrene (PS) to the surface of a poly(dimethylsiloxane) (PDMS) spin-coated film. It was found that the key driving force for blooming is the reduction of surface energy. This approach has met with limited acceptance owing to the blooming of molecules occurring immediately upon processing; rather it is desirable to control the timing of phase composition modification.

Kramer et al. have shown that the location of gold nanoparticles in a PS-b-poly(2-vinyl pyridine) (PS-b-P2VP) copolymer is controlled by adjusting the ligand composition from 100% PS to a 1:1 molar mixture of PS and P2VP ligands or by decreasing amounts of only PS-ligand used, which results in the equilibrium location of the gold nanoparticles from the center of the PS domains to the interface between microphase separated PS and P2VP lamellae (30, 31). Again, the location of the nanoparticle is determined a priori by ligand composition and coverage, which affect particle size, particle miscibility, and the adsorption energy of the particle at the interface between microphase separated domains.

Thus, there exists a need for a broadly applicable composition capable of migration within a polymer in response to a thermal stimulus matrix. Additionally, there exists a need for a composition capable of self-segregating to a polymeric matrix surface or migrating relative to other molecules of the composition in concert with a macromolecule particle to further modify the matrix surface without resorting to the application of subsequently applied coating.

SUMMARY OF THE INVENTION

A composition is provided that includes a polymer matrix. A core having a core surface is embedded within the polymer matrix. A polymeric ligand passivates the core surface and has a moiety Y, where Y is a Diels-Alder group of a diene or dienophile. A polymeric linker has a complementary Diels-Alder group diene or dienophile to moiety Y and forms a Diels-Alder bond with the moiety Y.

A composition is also provided that includes a polymer matrix having a matrix surface. A core having a core surface is present on the matrix surface. A polymeric ligand passivates the core surface and has a moiety Y, where Y is Diels-Alder group of a diene or dienophile. The polymer matrix and polymeric ligand together define a matrix-ligand Flory-Huggins binary interaction function greater than 0.

A process of thermally controlled particle core migration within a polymer matrix includes the distribution within a polymer matrix of multiple cores, each of which being passivated with polymeric ligands that form thermodynamically reversible Diels-Alder bonds with polymeric linkers within the polymer matrix. A thermal stimulus is provided to the polymer matrix to induce scission of the Diels-Alder bonds formed between ligand and linkers. With sufficient time after Diels-Alder bond scission, the cores migrate within said polymer matrix to a thermodynamically stable position.

BRIEF DESCRIPTION OF THE DRAWINGS

FIGS. 1A-D depict schematically steps by which a ligand passivated core is preferentially bloomed to a polymer matrix surface (A) homogeneous distribution of ligand-(first linker) and ligand-(second linker) terminated cores within polymer matrix, (B) thermally stimulating ligand-(first linker) with sufficient energy input to induce bond scission between ligand and first linker thereby changing the net Flory-Huggins binary interaction function for the core to a number weighted average of χ ligand and χ second linker relative to the polymer matrix, (C) thermally stimulating ligand-(second linker) with sufficient energy input to induce bond scission between ligand and second linker thereby changing the Flory-Huggins binary interaction function for the core to a χ ligand relative to the polymer matrix, and (D) first linker and second linker diffuses within miscible polymer matrix while the immiscible core-ligand blooms to the polymer matrix surface;

FIGS. 2A-D depict schematically steps by which a core is controllably diffused into a polymer matrix to form a matrix having a graded density of cores therein (A) a collection of cores terminated with ligand-linkers are applied to a polymer matrix surface, (B) thermally stimulating ligand-linker with sufficient energy input to induce bond scission between ligand and linker thereby changing the Flory-Huggins binary interaction function for the core to a $\chi$ ligand relative to the polymer matrix, (C) polymer matrix immiscible linker remains on the polymer matrix surface while the miscible core-ligand diffuses into the polymer matrix; and (D) with sufficient diffusional time, a polymer matrix having a graded density of core-ligands is obtained, a core number distribution graph is provided along the right edge of FIG. 2D;

FIGS. 5A-E depict schematically steps by which a ligand passivated core is preferentially bloomed to structured polymer matrix surfaces (A) homogeneous distribution of ligand-linker terminated cores within a polymer matrix that has been exposed to a negative mask lithographic process where exposed regions of the polymer matrix are shaded, (B) selective dissolution of photolyzed portions of the polymer matrix, (C) thermally stimulating ligand-linker with sufficient energy input to induce bond scission between ligand and linker thereby changing the Flory-Huggins binary interaction function for the core to a $\chi$ ligand relative to the polymer matrix, (D) linker diffuses within miscible polymer matrix while the immiscible core-ligand blooms to the structured polymer matrix surface, and (E) a material is deposited into the voids left by dissolution of the photolyzed portions of the polymer matrix and the remaining polymer matrix is removed to retain cores on the surface of the deposited material;

FIGS. 6A-C depict schematically steps by which a ligand passivated core renders a transparent polymer matrix opaque (A) homogeneous distribution of ligand-linker terminated cores within polymer matrix, (B) thermally stimulating ligand-linker with sufficient energy input to induce bond scission between ligand and linker thereby changing the Flory-Huggins binary interaction function for the core to a $\chi$ ligand relative to the polymer matrix, and (C) linker diffuses within miscible polymer matrix while partially miscible core-ligand units agglomerate within polymer matrix to form a light scattering inclusion;

DESCRIPTION OF THE PREFERRED EMBODIMENTS

Figure 3A:
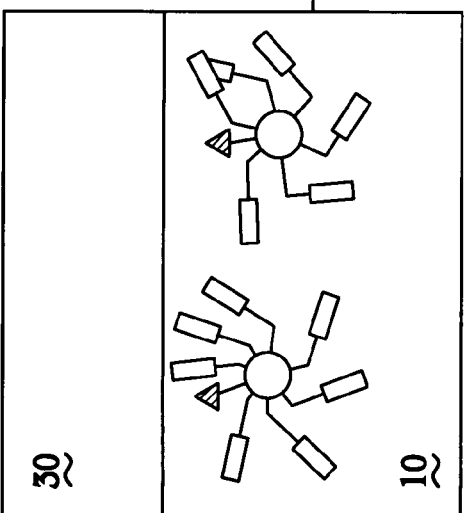
FIGS. 3A-D depict schematically steps by which a ligand passivated core blooms from a polymeric matrix into an adjoining immiscible second polymer matrix (A) homogeneous distribution of ligand-linker terminated cores within polymer matrix, (B) thermally stimulating ligand-linker with sufficient energy input to induce bond scission between ligand and linker thereby changing the Flory-Huggins binary interaction function for the core to a $\chi$ ligand relative to the polymer matrix, and (C) linker diffuses within miscible polymer matrix while the immiscible core-ligand blooms to the polymer matrix surface and (D) the core-ligands enters a polymer-core ligand miscible second polymer matrix.
Figure 3B:
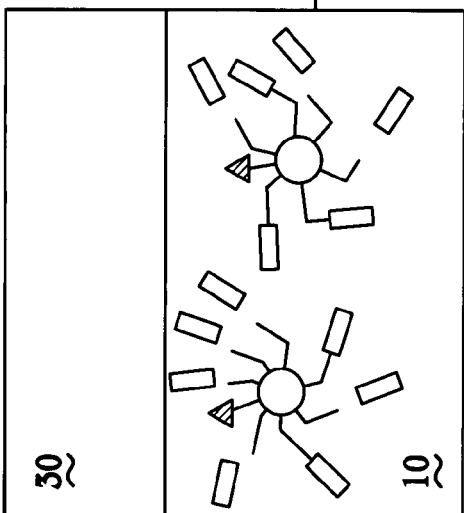
Figure 3C:
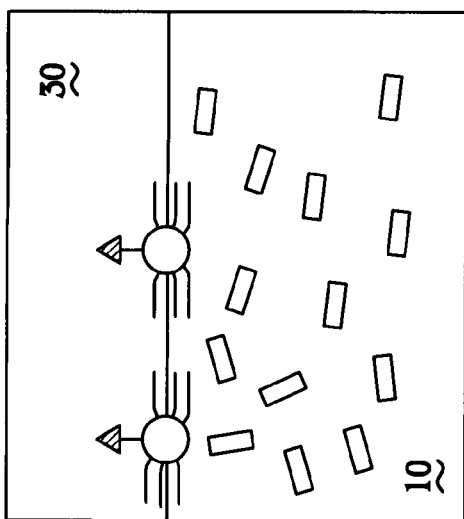
Figure 3D:
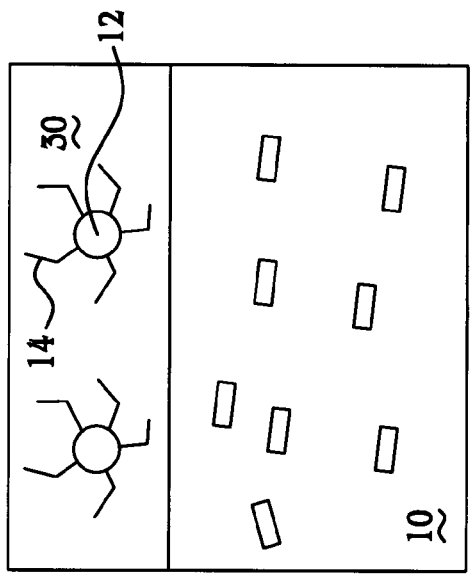
Figure 4A:
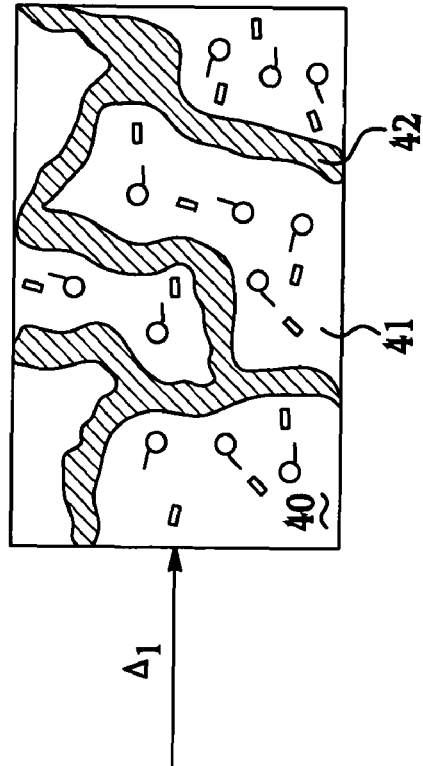
FIGS. 4A-D depict schematically steps by which a ligand passivated core is located in a high porosity polymer phase matrix, with only a single non-enveloping ligand and linker shown attached per core for the sake of visual clarity (A) homogeneous distribution of ligand-linker terminated cores are provided within a first phase of a two phase emulsion polymeric matrix (B) thermally stimulating ligand-linker with sufficient energy input to induce bond scission between ligand and linker thereby changing the Flory-Huggins binary interaction function for the core to a $\chi$ ligand relative to the polymer matrix, (C) ligand passivated cores diffuse into miscible second phase of emulsion polymeric matrix while the linker diffuses in first phase of matrix, (D) selective dissolution of the first phase of the emulsion or microemulsion polymeric matrix.
Figure 4B:
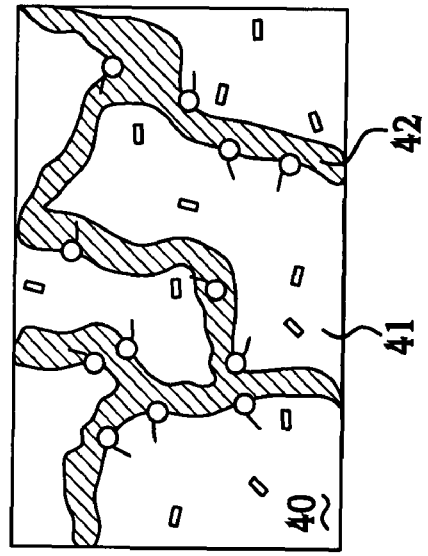
Figure 4C:
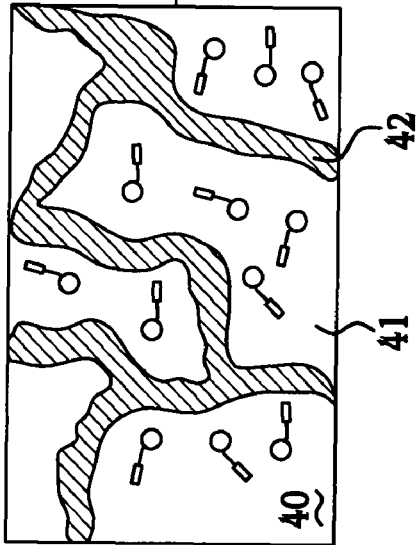
Figure 4D:
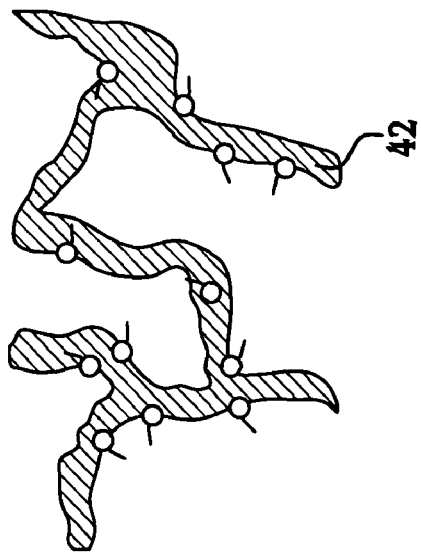

The present invention has utility in the controlled migration of a core embedded within a polymer matrix. The core is passivated with a ligand that reversibly forms a Diels-Alder bond to a linker species in response to a thermal stimulus. By selecting Flory-Huggins binary interaction functions ($\chi$) for the ligand-matrix and linker-matrix, the miscibility or immiscibility of the ligand and the attached core relative to the polymer matrix is changed with application of a thermal stimulus. In a simple form of the present invention, the core passivating ligand is bonded to the linker by a Diels-Alder bond with the linker having a negative $\chi$ value relative to the polymer matrix resulting in miscibility of the core-ligand-linker composition and after application of a thermal stimulus, the Diels-Alder bond is broken resulting in the miscible linker diffusing within the polymer matrix while the immiscible ligand having a positive $\chi$ value relative to the polymer matrix causes the core to bloom to the polymer matrix surface. The ability to carry a core or a species secured to the core to a matrix surface allows for efficient utilization of the core and surface modifying species attached to the core.

The ability to preferentially modify a matrix surface with a surface modifying species allows for efficient utilization of cores alone, or in combination with an associated surface modifying species. Polymeric matrix materials operative according to the present invention include a variety of thermoplastic and thermoset systems in applications as diverse as bulk polymers, polymer coatings, fabrics, fibers, and composites. Cores alone, or in combination with an associated surface modifying species offer the ability to render a matrix surface modified with respect to a variety of properties illustratively including scratch resistance, biocidal nature, optical properties, recognition of specific molecules exposed to the surface, tolerance towards an environmental factor such as ultraviolet light, heat, or corrosion. Additionally, a second matrix immiscible with the polymer matrix is readily chosen to have a negative $\chi$ value relative to the ligand passivated core to induce bloom of the core from the immiscible polymer matrix into the second matrix in which the ligand passivated core is miscible.

Through adjustment of the relative miscibility of the ligand, linker, and one or more polymer matrices, a core passivated by the ligand and embedded within a polymer matrix is readily driven to the surface of a polymer matrix, driven into a polymer matrix from the surface, or caused to agglomerate with other like or different core materials embedded within a polymer matrix in response to scission of a thermally reversible Diels-Alder bond. While most specific ligand passivated core materials are synthesized separately and added to a polymer matrix, it is appreciated that some core particles are synthesized and passivated in situ within the polymer matrix. By way of example, metal particle precursors are amenable to being dispersed within a polymer matrix along with a reducing agent such as a polyol or alkylamine along with a polymer matrix miscible passivating agent or passivating agent-ligand that associates with in situ synthesized core upon formation. Additionally, a dendrimer core is also amenable to in situ formation within a polymer matrix through conventional oxazoline chemistry.

A core according to the present invention has a size of from 1 to 1000 nanometers linear dimension along the long axis of the core and is formed of any number of molecules, such as dyes; macromolecules, such as polymers, capsules containing a substance, dendrimers, polypeptides, and polysaccharides; microelectromechanical system (MEMS) structures; and particles-adhered to a polymeric ligand. Particle cores operative herein are synonymously described as nanoparticles or nanowires. It is appreciated that the rate of core migration is dictated by factors including size, miscibility relative to a proximal polymer matrix, and matrix viscosity at the migration temperature. Preferably, the maximal linear dimension of particle cores used herein is between 4 and 100 nanometers. Core shapes illustratively include spherical, oblate, prolate, cylindrical, conical, and combinations thereof. A core has a passivating ligand coating the particle. The exposed terminus of the passivating ligand includes a reactive Diels-Alder moiety of either a diene or dienophile capable of forming a covalent Diels-Alder bond with the inventive linker. Cores operative herein illustratively include colloidal silica; silica alumina; carbon black; silica magnesia; magnesium silicate; magnetic cobalt containing alloys; magnetic niobium containing alloys; metals such as transition metals, lanthanides, main group V and VI metals, or alloys of two or more aforementioned metals from transition-lanthanide or main groups of the periodic table; metal-oxides, -sulfides, -carbides, -nitrides, -arsenides, -phosphides, such as $TiO_2$, $ZnO$, $WO_3$, $SnO_2$, $CaTiO_3$, $Fe_2O_3$, $MoO_3$, $Nb_2O_5$, $TixZr_{(1-x)}O_2$, $SiC$, $SrTiO_3$, $CdS$, $CdSexTe_{1-x}$, $CdSe$, $GaP$, $InP$, $GaAs$, $BaTiO_3$, $KNbO_3$, $Ta_2O_5$, $Bi_2O_3$, $NiO$, $Cu_2O$, $SiO_2$, $MoS_2$, $InPb$, $RuO_2$, $CeO_2$, $Ti(OH)_4$, or $TiN$; silicon; fullerenes; nanolatex; epoxidized rubber; polystyrene nanospheres; encapsulated substances such as a liquid in a polymeric capsule; and barium strontium titanate $(Ba,Sr)TiO_3$.

A passivating polymeric ligand according to the present invention has the formula:

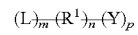

$$(L)_m\text{---}(R^1)_n\text{---}(Y)_p \qquad (I)$$

Where L is independently in each occurrence a moiety reactive with a core surface site and includes $NHR^2$—, [imidazole-$R^2$], HS—, HO—, $R^3OOC$—, $C(R^2)_2$=$CR^2$—, $R^1C$=CH—HC=$CR^3$, OCN—, XOC—(X=Cl, Br, I), $R^2$=C—, $N_3$—, m is an integer 1, 2 or 3; $R^2$ is independently in each occurrence hydrogen or $C_1$-$C_4$ alkyl; $R^2$ is an electron, hydrogen, $C_1$-$C_4$ alkyl; $R^1$ is a monomer that has a linear backbone of $C_2$-$C_6$ alkyl, —$(R^2)_2Si$—O—, $C_2$-$C_6$ alkyl-Q-$C_2$-$C_6$ alkyl, $C_2$-$C_6$ glycol, $C_6$-$C_{24}$ aryl, $C_6$-$C_{24}$cycloalkyl, ethers-, esters-, thioethers- and amides- of $C_2$-$C_{24}$ alkyl, as well as substituted forms of any of the aforementioned $R^1$ monomers to form a branched polymer or a cross-linked polymer where a substituent for a proton is in one or more instances $C_6$-$C_{24}$ aryl, $C_1$-$C_{24}$ alkyl, or heteroatom containing alkyl or aryl substituents where the heteroatom is present as an amine, phosphosate, thiol, alcohol, carboxyl, or the like; Q is sulfur or oxygen; n is an integer value between 10 and 1000 and preferably chosen to yield a ligand with a molecular weight of between 500 and 10,000 g/mol. It is appreciated that while the $\chi$ value between a ligand passivated core and a polymer matrix ($\chi_{LIG}$) is increased in absolute value with increasing value of n, high n values decrease the kinetic mobility for a core migrating in a given matrix at a given temperature. Preferred values of n yield a ligand with a molecular weight of between 1000 and 8000 g/mol. Y is a Diels-Alder reactive moiety of a diene or a dienophile and p is an integer 1, 2 or 3. Representative dienes and dienophiles illustratively include maleimide, acid anhydrides, furans, and alkenes. It is appreciated that Y need not be terminal moiety and is optionally a pendent moiety.

The linker has a general formula $$(Y')_p-(R^{1'})_n \quad (II)$$

where $R^{1'}$ in each occurrence is any one of the monomers detailed with respect to $R^1$; Y' is a complementary Diels-Alder reactive moiety relative to Y of the ligand of Formula (I) and selected from the Y moieties listed such that Y' is a dienophile when Y is a diene, and vice versa; n and p have the same values as detailed with respect to the ligand in Formula (I). The linker preferably has a $\chi$ value with a surrounding polymer matrix ($\chi_{LINK}$) dissimilar to that of the ligand in instances when migration of the core is desired into or out of the matrix based upon the presence of the Diels-Alder bond.

The present invention resorts to Diels-Alder chemistry to provide a bond that is subject to reversible scission in response to a thermal stimulus. Through control of $\chi_{LIG}$ and $\chi_{LINK}$ and a Diels-Alder Y—Y' bond equilibrium as a function of temperature, a ligand passivated core is induced to migrate in a polymer matrix with input of a thermal stimulus.

A generic Diels-Alder reaction is provided in Scheme 1 for a furan and maleimide.

Scheme 1

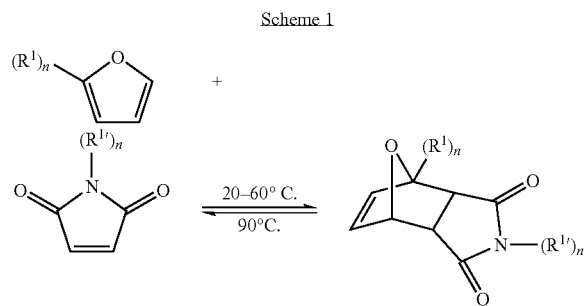

The specifics of Diels-Alder chemistry are well established in the art (32, 33).

The nature of the polymer matrix is virtually without limit and need only be nonreactive with the ligand and linker. Representative polymer matrix materials illustratively include polyalkylenes, polycarbonates, polystyrene, polyacrylates, polyvinyl pyrrolidones, polyureas, polyurethanes polynitrites, celluloses, polyacrylamides, polyacetones, polybutadienes, polymethamethacrylates, polyacrylonitriles, polyesters, polyvinyl alcohols, polyethers, block copolymers-, emulsions-, or microemulsions- of two or more of the above representative polymers.

It is appreciated that multiple ligands of Formula I are used to passivate a core and in such a case $\chi_{LIG}$ is a mass weighted sum of $\chi$ values associated with each of the individual ligands. Likewise, multiple linkers at varying chemical composition from one another are used to form Diels-Alder bonds Y—Y' with ligands. It is appreciated that through the selection of Diels-Alder reaction moieties Y and Y' that have different activation energies, migration of a ligand passivated core is readily converted from a binary process of non-migration or migration based on whether a thermal stimulus has been applied to a stepwise process with different temperatures resulting in a stepped core migration of a core so that the thermal reversibility temperature is reached for each Diels-Alder bond present between ligand and linker type.

In addition to the use of a Diels-Alder bond between the ligand and linker, the present invention relies on an adjustment of miscibility differences between the ligand-polymer matrix and linker-polymer matrix to affect core migration in response to the direction of the Diels-Alder reaction towards ligand-linker bond formation or bond scission. A thermodynamic prediction estimate of miscibility of polymers is provided by the Flory-Huggins theory which when applied to a system yields a function $\chi$ known as the Flory-Huggins binary interaction parameter which nonetheless has a functional dependency on quantities such as temperature, concentration, pressure, molar mass, molar mass distribution and theoretical -modeling parameters such as coordination number of the lattice and segment length. The operation of the Flory-Huggins theory and the calculation of $\chi$ are well known to the art (34, 35). In brief, assuming random mixing of two polymers and no change in volume associated with mixing, the combinatorial entropy of mixing $\Delta S_m$ of the Flory-Huggins theory is given by the equation:

$$\Delta S_m = -R\left[\frac{\phi_1}{r_1}\ln\phi_1 + \frac{\phi_2}{r_2}\ln\phi_2\right] \quad (III)$$

where $\phi_i$ is the volume fraction of the component i and $r_i$ is the number of polymer segments, R is the gas constant. It can be seen that the entropy of mixing decreases with increasing molar mass, $r_i$ is proportional to the degree of polymerization, and vanishes for infinite molar masses. Applying the concept of regular solutions and assuming all pair interactions in the framework of a mean-field theory yields for the enthalpy of mixing, $\Delta H_m$ to equation:

$$\Delta H_m = RT\chi\phi_1\phi_2 \quad (IV)$$

For binary systems the Flory-Huggins equation can be expressed as the equation:

$$\Delta G_m = RT\left[\frac{\phi_1}{r_1}\ln\phi_1 + \frac{\phi_2}{r_2}\ln\phi_2 + \chi\phi_1\phi_2\right] \quad (V)$$

where $\chi$ is the so-called Flory-Huggins binary interaction parameter. R is the universal gas constant, and T is the absolute temperature. The first two terms of the right-hand side in Equation V are related to the entropy of mixing and the third term is attributable to the enthalpy of mixing.

For polymers having infinite molar mass (i.e. $r_i$ is infinite) the entropic contribution is very small and the miscibility or immiscibility of the system mainly depends on the value of the enthalpy of mixing (Equation IV). Miscibility is achieved only when $\chi$ is negative. Based on Flory-Huggins theory, Flory-Huggins binary interaction parameters have been calculated for a variety of polymer blends (36-40). By way of example, relevant to a specific inventive system detailed in the following examples, the Flory-Huggins binary interaction parameter for polystyrene and polyethylene glycol is 0.0644 at 20° Celsius (41) while the value for polyethylene glycol and polymethyl methacrylate is −0.005 at 20° Celsius (42).

Referring now to FIGS. 1A-D, a polymer matrix 10 has a core 12 embedded therein. The core 12 is passivated with a ligand 14. The ligand 14 has a structure of Formula I and a polymeric portion-$(R^1)_n$-defining a Flory-Huggins binary interaction function $\chi_{LIG}$ greater than 0 with the matrix 10. Optionally, a surface modifying species 16 is bonded to the core 12 as provided to modify properties of matrix surface 18. The surface modifying species 16 illustratively includes a chromophore, protein, antibody, saccharide, a nanoparticle, a nanowire or a second type of core. As shown in FIG. 1A, a first polymer linker 20 forms a Diels-Alder bond with ligand 14 through moieties Y and Y' as detailed with respect to Formulae I and II. The Flory-Huggins binary interaction function of the first linker 20 with the polymer matrix $\chi_{LINK1}$ is less than 0. Optionally, a second polymer linker 22 is provided that is compositionally distinct from the first linker 20 and also forms Diels-Alder bonds with the linker 14. The Flory-Huggins binary interaction function between the second linker 22 and the polymer matrix 10 $\chi_{LINK2}$ is less than 0. The proportion weighted sum of the first and second linkers $\chi_{LINK1}$ and $\chi_{LINK2}$ is less than 0 and manifests as miscibility for the linker bonded ligand-core in the polymer matrix 10.

Upon heating the polymer matrix 10 to a temperature for a sufficient amount of time ($\Delta_1$) the Diels-Alder bond between ligand 14 and first linker 20 dissociates with the first linker 20 diffusing within the matrix 10 while the core 12 optionally coupled to a surface modifying species 16 and passivating with ligand 14 in some instances remaining linked by a Diels-Alder bond to the second linker while other Y moieties of ligand 14 are exposed to the polymer matrix 10. With the loss of contribution of $\chi_{LINK1}$ to the composite core-ligand system, the core 12 is now less miscible with the matrix 10 and has a modest tendency to phase, separate to matrix surface 18. It is appreciated that the ratio of first linker to second linker, and the value of $\chi_{LIG}+\chi_{LINK2}$ are some of the factors relevant indicating the kinetics of core migration to matrix surface 18.

As, seen in FIG. 1C, upon applying a quantity of thermal energy ($\Delta_2$) in the form of elevated temperature relative to that applied in $\Delta_1$, the Diels-Alder bonds between second linker 22 and ligand 44 dissociate and linker 22, with miscibility with the matrix 10 diffusing in the matrix 10. The core 12 with optional surface modifying species 16 and ligand 14 has a positive Flory-Huggins binary interaction function, $\chi_{LIG+}$. As shown in FIG. 1D, the core 12 with passivating ligand 14 and optional surface modifying species 16 is immiscible and migrates to the polymer matrix surface 18 thereby exposing surface modifying species 16 and selectively enriching the surface 18 and core 12. As shown schematically the ligands potentially change conformation on the surface 18. While FIGS. 1A-1D depict only a single type of core 12, it is appreciated that cores of variable composition, size, or surface modifying species are also operative herein.

Polymer matrix 10 with a modified surface 18 as depicted in FIG. 1D is readily applied as a coating on a piezoelectric crystal to form a sensor selective for species selectively bindable to a surface modifying species 16. By way of example, a surface modifying species 16 is an antibody selective for surface antigens of a *Bacillus anthracis* spore. Surface modifying antibodies are protected within the polymer matrix having a prolonged storage lifetime and only exposed on the matrix surface 18 in response to a desire to commence sampling a potentially contaminated medium such as air. Underlying piezoelectric sensing absorption of a spore through a change in piezoelectric oscillation frequency.

Referring now to FIGS. 2A-2D where like numerals correspond to those used with respect to FIG. 1, a polymer matrix 10 is overlayered with multiple cores 12 passivated with ligand 14' where ligand 14' varies from ligand 14 in having Flory-Huggins binary interaction function $\chi_{LIG}$ of less than 0 and ligands 14' forming a Diels-Alder bond with a linker 20' where the linker 20' differs from linker 20 per FIG. 1 in having a Flory-Huggins binary interaction function $\chi_{LINK'}$ with a polymer matrix 10 of greater than 0, as shown in FIG. 2A. Upon application of a quantity of thermal energy in the form of raising the temperature of matrix 10 ($\Delta_1$) Diels-Alder bond between linker 20' and ligand 14' is dissociated with the ligand passivated core 12 now being miscible with the matrix 10 while linker 20' is immiscible with the matrix 10 as shown in FIG. 2B. With time, the core 12 passivated with ligand 14' diffuses into matrix 10, as shown in FIG. 2C. As diffusion is a kinetically controlled process and the migration extent has a Brownian motion component, upon allowing sufficient time for diffusion of core 12 passivated with ligand 14 into the matrix 10, a matrix 10 having a graded density of polymer cores 12 therein is obtained, as shown in FIG. 2D. A core distribution graph is provided adjacent to FIG. 2D to represent core density as a function of distance from matrix-surface 18.

FIG. 3 depicts the diffusion of a core 12 passivated with ligand 14 from polymer matrix 10 in which ligand 14 is immiscible, into a second polymer matrix 30 where the second polymer matrix 30 is also immiscible with polymer matrix 10; and like numerals used in FIG. 3 have the meaning attributed to those numerals with respect to the preceding figures. FIGS. 3A-3C parallel the steps of FIGS. 1A-1C, respectively. As shown in FIG. 3D, the ligand 14 passivating core 12 has a negative Flory-Huggins interaction function with matrix 30 and therefore diffuses into the second matrix. The second polymer matrix 30 is applied in contact with matrix surface 18 through conventional techniques illustratively including coextrusion, addition of a surfactant, flame surface treatment, plasma surface treatment, the addition of coupling agents such as a silane, or other conventional adhesion techniques.

In instances where a high surface area matrix surface is desired that is populated with cores, the present invention provides core migration in response to a thermal stimulus to provide complex matrix surface. Complex matrix surface configured as channels or structured are produced through various dual phase emulsions, and lithographic techniques common to microelectronics and MEMS devices.

Referring now to FIG. 4 where like numerals correspond to those used with respect to the prior figures, cores 12 passivated with ligand 14 and having Diels-Alder bonds to linkers 20 are dispersed throughout a microemulsion polymer matrix 40. The microemulsion polymer matrix 40 is composed of a first polymer phase 41 having an identity such as that of polymer matrix 10 in which linker 20 is miscible and ligand 14 is immiscible. The second polymer phase 42 of polymer matrix 40 is separated from the first polymer phase 41 through the inherent immiscibility of the phases. The second polymer phase 42 is shown in FIG. 4 in shaded form. Based on the Flory-Huggins binary interaction function being negative between the core 12 passivated with ligand 14 and terminated with linkers 20, the cores 12 are preferentially distributed within the first phase 41 of polymer matrix 40, as shown in FIG. 4A. Upon applying a quantity of thermal energy, $\Delta_1$, the Diels-Alder bond between linker 20 and ligand 14 is dissociated, as shown in FIG. 4B. The cores 12 with passivating ligands 14 are rendered immiscible in first polymer phase 41 and preferentially bloom to the interface of polymer phases 41 and 42 and then migrate into second polymer phase 42 in which linker 14 is miscible. Upon segregation of cores 12 passivated with ligands 14 in the secondary phase 42, polymer matrix 40 is subjected to selective dissolution of first polymer phase 41 leaving a highly porous matrix now composed only of secondary polymer phase 42 containing cores 12 therein, as shown in FIG. 4D. Techniques for selective removal of one polymer of a microemulsion are well known to the art and illustratively include differential dissolution rates in solvent, and photolysis, and catalytic depolymerization. While FIG. 4 depicts a two phase polymer matrix 40, it is appreciated that the polymer matrix 40 is readily substituted with an interpenetrating network in which two polymers are separately polymerized yet occupy the same volume.

The present invention is also operative in the context of a polymer matrix patterned through photolithography. As shown in FIGS. 5A-D where like numerals correspond to those used with respect to the previous figures, a polymer matrix 10 containing cores 12 passivated with ligand 14, ligand 14 in turn coupled to linker 20 through a Diels-Alder bond is distributed throughout a polymer matrix 10 in which regions of the matrix 10 have selectively been exposed to a light source inducing a chemical change in the regions of the matrix 10 denoted at 50. FIG. 5 depicts a negative photolithography process, and it is appreciated that the present invention is equally well operative with photolithography positive matrix materials 10. Photolyzed regions 50 of the polymer matrix 10 are then selectively removed through a conventional technique such as solvent dissolution or evaporation as shown in FIG. 5B. A quantity of thermal energy is applied to the remaining patterned portions of matrix 10 denoted at 52 in the form of heating for a certain amount of time, $\Delta_1$, to induce scission of the Diels-Alder bond between ligand 14 and linker 20, as depicted in FIG. 5C. With sufficient time, the linker 20 remains distributed throughout remaining polymer matrix regions 52 while cores 12 passivated with ligand 14 migrate to surface 54 of remaining polymer matrix regions 52, as shown in FIG. 5D. It is appreciated that when the cores 12 exhibit-quantum effects, based on the spacing between remaining regions 52, as well as the identity of cores 12, that tunneling, and other inter-core optical, magnetic and physical effects are noted. Optionally, the regions between remaining polymer matrix portions 52 are filled with a polymeric, inorganic or semiconducting subsequently applied material 56 through the use of conventional techniques such as spin coating, in situ polymerization with respect to polymers; physical vapor deposition or chemical vapor deposition with respect to inorganic or semiconductor materials. Following polishing to remove overburden of the subsequently applied material 56, the remaining portions 52 of the polymer matrix are optionally removed as shown in FIG. 5E to create an array of structured subsequently applied material 56 having a surface decorated with cores 12 that mirror the dimensions of photolyzed regions 50. It is appreciated that a core 12 is optionally used as a nucleation seed from which the material 56 is grown through physical or chemical vapor deposition processes, electrochemical deposition, atomic layer deposition or the like.

The present invention is also operative through control of Flory-Huggins binary interaction functions to transform an optically transparent material opaque through thermal stimulus. As shown in FIGS. 6A-C where like numerals correspond to those used with respect to the previous figures, cores 12 are passivated with ligands 14' that in turn are joined to linker 20 through a Diels-Alder bond. Cores 12 passivated with ligands 14' and terminated in linker 20 are distributed throughout polymer matrix 10 with a spacing such that core-core interactions provide only nominal scattering of photons traversing the polymer matrix 10, as shown in FIG. 6A. With introduction of a quantity of thermal energy, $\Delta_1$, the Diels-Alder bond between ligand 14' and linker 20 is dissociated allowing linker 20 to diffuse within the polymer matrix 10, as shown in FIG. 6B. As linker 14' is miscible in polymer matrix 10 based on a Flory-Huggins binary-interaction function that is negative, cores 12 passivated by ligand 14' also migrate within polymer matrix 10, FIG. 6B. Based on attractive interactions between ligands 14' with other ligands 14' such as hydrogen bonding, van der Waal's attractions and the like, cores 12 approach to a core-to-core distance sufficiently close to scatter photons traversing the polymer matrix 10 thereby rendering the polymer matrix 10 opaque as depicted in FIG. 6C. As the Diels-Alder bond is thermodynamically reversible, the inventive system depicted in FIGS. 6A-C is appreciated to be operative as a thermoresponsive window or optical element.

The present invention is further detailed with respect to an exemplary specific system that further highlights attributes of the present invention. These examples are considered to be non-limiting and are not intended to limit the scope of the appended claims.

EXAMPLE 1

Figure 7:
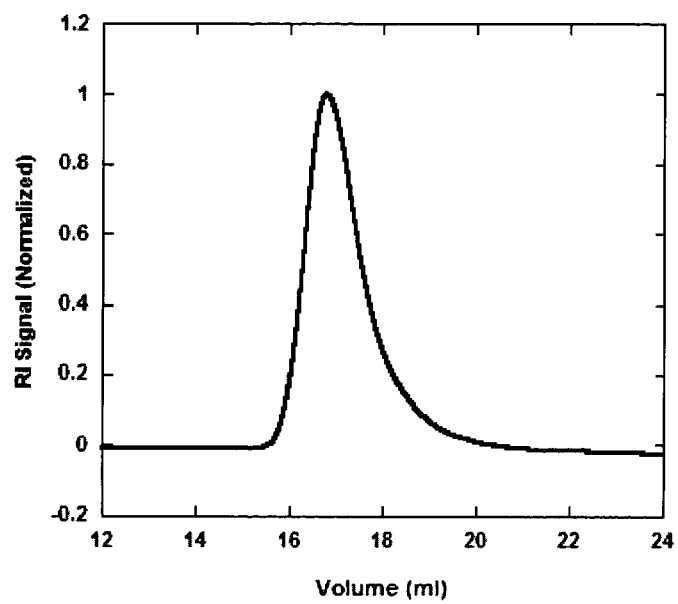
FIG. 7 is a gel permeation chromatograph of $\alpha$-furyl-$\omega$-S-thiobenzoyl poly(styrene) prepared by reversible addition fragmentation transfer to yield a molecular weight of 4,700 grams/mol (g/mol) and a polydispersity index (PDI) of 1.14.

Synthesis of Diels-Alder (DA) Linked Polyethylene Glycol (Link)-b-Polystyrene (Ligand) Copolymer Ligand-Linkage Schemes S1 through S3 illustrate the synthetic route utilized to ultimately form the DA-linked PEG-b-PS copolymer ligand for nanoparticle functionalization. Commercially available α-methoxy-ω-hydroxy PEG ($M_n$-550 g/mol, PDI<1.05) is treated with methane sulfonyl chloride to convert the ω-chain end into a mesylate. After the addition of maleimide, N alkylation occurred under basic conditions to yield α-methoxy-ω-maleimido PEG (polymer 1) in 95% yield, Scheme S1. Reversible addition fragmentation transfer (RAFT) polymerization of styrene is chosen to address the need for an α-furyl-ω-mercapto PS, as previous work has demonstrated the facile transformation of the dithioester chain end to a mercapto functionality (1). Furyl alcohol is transformed into a RAFT polymerization initiator in two steps with an overall yield of 85%, Scheme S2. Typical RAFT polymerization conditions of styrene utilize thermal initiation, in which radical formation occurs after a DA reaction between two styrene molecules. Therefore, azobisisobutyronitrile (AIBN) is employed as a radical source to reduce reaction temperatures and eliminate unwanted DA reactions as shown in Scheme S3. FIG. 7 shows a gel permeation chromatograph of polymer 2, illustrating a narrow Gaussian distribution typical of polymers prepared using RAFT polymerization.

Scheme S1.
Synthetic route for preparation of
α-maleimido-ω-methoxy poly(ethylene glycol) (polymer 1).

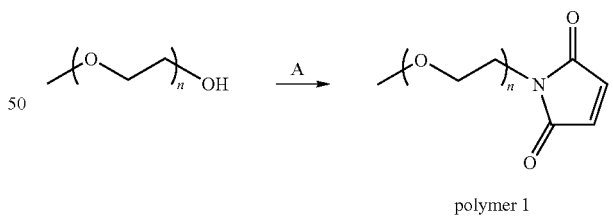

polymer 1

Conditions: A) i) $Et_3N$, MsCl, $CH_2Cl_2$, 0° C.-RT, 4 h; ii) solid $K_2CO_3$, maleimide, tetrahydrofuran (THF), reflux, 12 h.

Scheme S2.
Synthetic route for preparation of RAFT initiator (Compound 2).

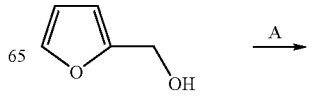

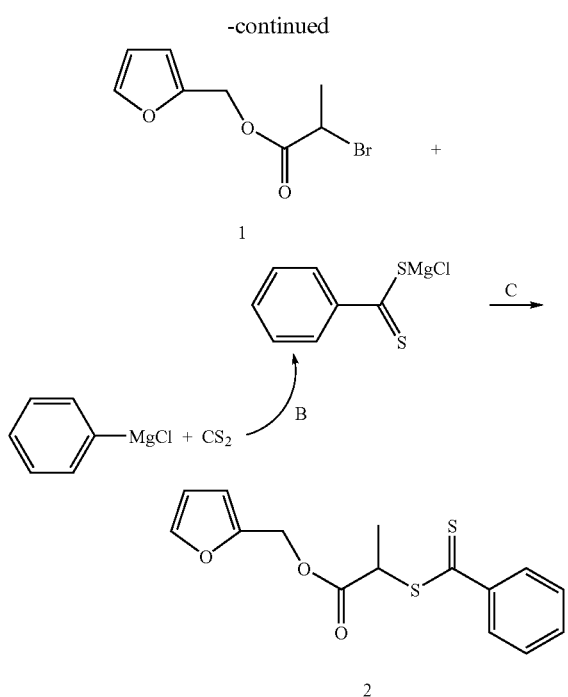

Conditions: A) Et₃N, 2-bromopropionyl bromide, CH₂Cl₂, 0° C.-RT, 12 h; B) THF, −78° C. for 15 min, RT for 1 h; C) THF, RT, 5 h.

Scheme S3.
Synthetic route for preparation of furyl functionalized Au nanoparticles (polymer 3-Au).

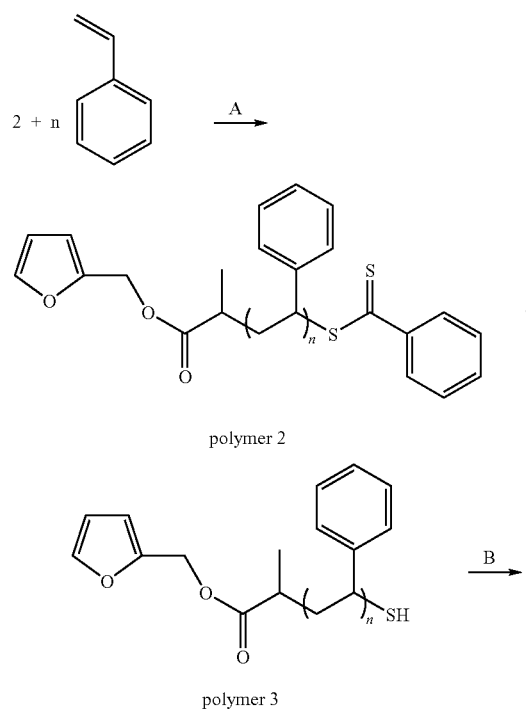

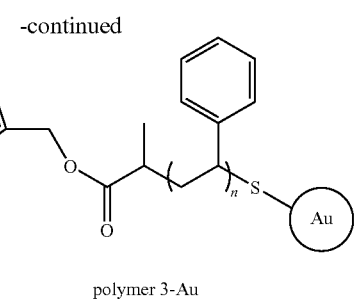

polymer 3-Au

Conditions: A) AIBN, THF, 70° C., 19 h; B) NaBH₄, EtOH, THF, RT, 20 h; C) Toluene, reflux, 2 h.

Preliminary experiments demonstrated the ability to tether polymer 1 and polymer 2 via Diels-Alder reactions. α-Methoxy-ω-maleimido PEG is stirred at 60° C. in THF with α-furyl-ω-S-thiobenzoyl PS for several days. After five days, the sample is precipitated in CH₃OH, and the isolated polymer is analyzed by $^1$H NMR. The appearance of methylene peaks at 3.60 ppm confirmed the presence of polymer 2 demonstrating the ability to tether polymer 1 and polymer 2 together via a Diels-Alder reaction to yield the 1-DA-2 copolymer that is analogous to the polymer ligand needed for the compatibilization of the nanoparticles with the PEG matrix. To demonstrate the reversibility of this chemistry, the isolated 1-DA-2 copolymer is dissolved in toluene and heated at 90° C. for 12 h. The reaction mixture is precipitated into CH₃OH, and the resulting polymer is analyzed by $^1$H NMR. The absence of methylene peaks at 3.60 ppm implied the Diels-Alder bond had been severed. Polymer 2 precipitated upon addition of CH₃OH while polymer 1 remained in solution. NMR peaks at 1-3 ppm and 6.8-7.4 ppm typical of PS are also observed.

EXAMPLE 2

Gold Nanoparticle Synthesis

Au nanoparticles are prepared according to a previously published method (44), then characterized by small angle X-ray scattering (SAXS) and transmission electron microscopy (TEM). The SAXS data is well fit using a log-normal size distribution for a spherical particle shape. The particle size distribution mode is found to be 8.93 nm, the median 9.82 nm, and the mean 10.1 nm.

Figure 8:
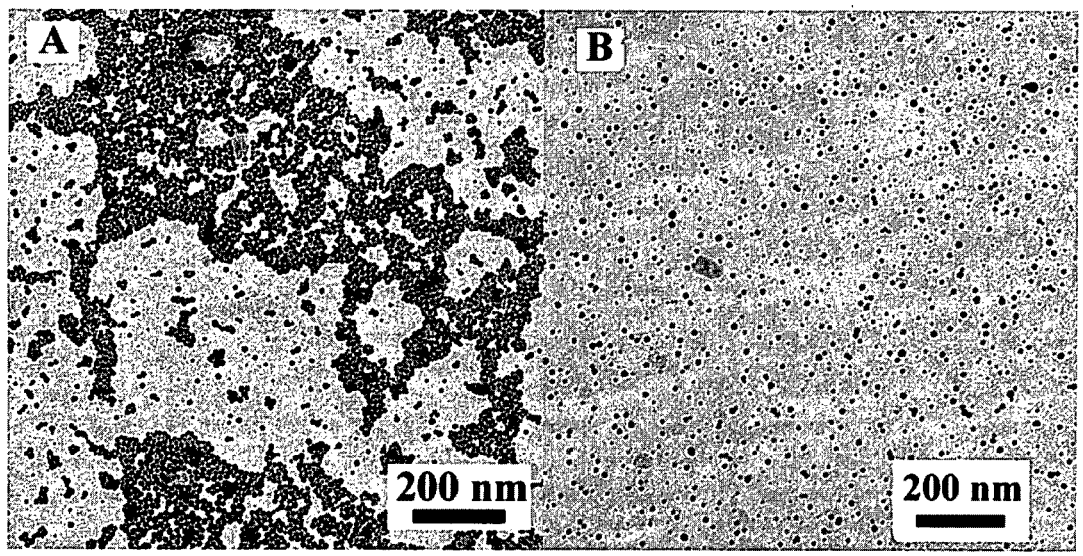
FIGS. 8A and 8B are transmission electron microscopy (TEM) micrographs of: (A) oleylamine passivated Au nanoparticle cores (12 nm±7 nm); and (B) polymer 3-Au nanoparticle cores (11 nm±6 nm) exhibiting an increased core-core spacing relative to FIG. 8A due to the presence of polymer 3.

FIG. 8A depicts a typical TEM micrograph of oleylamine functionalized Au nanoparticles. Analysis using the ImageJ program resulted in a nanoparticle diameter of 12 nm±7 nm, which is in good agreement with size distribution determined from SAXS.

Next, α-furyl-ω-S-thiobenzoyl PS is treated with NaBH₄ to prepare α-furyl-ω-mercapto PS, polymer 3, which is utilized in a ligand exchange reaction to passivate Au nanoparticles to yield polymer 3-Au, as shown in Scheme S3. Then, furyl functionalized Au nanoparticles are stirred at 60° C. in THF with excess equivalents polymer 1 for several days to yield 1-DA-3 di-block copolymer functionalized Au nanoparticles, 1-DA-3 Au. Repeated cycles of centrifugation, decanting and resuspension are used to remove excess polymer 1. The resulting 1-DA-3 Au is stored as a stock solution in THF. FIG. 8B depicts a typical TEM micrograph of linker-ligand passivated gold cores (1-DA-3 Au). The increased spacing between the nanoparticles indicates the presence of polymer

EXAMPLE 3

Synthesis of furyl-2-bromopropionate (Compound 1) of Scheme S2

Furyl alcohol (5.00 mL, 58.0 mmol), triethylamine ($Et_3N$) (10.5 mL, 75.4 mmol), and $CH_2Cl_2$ (150 mL) are added to a 250 mL round bottom flask and cooled to 0° C. Next, 2-bromoprionyl bromide (7.30 mL, 69.0 mmol) is added dropwise slowly. The reaction mixture is stirred at RT for 12 h. $H_2O$ (150 mL) is added, and the reaction is then extracted with $CH_2Cl_2$ (2×100 mL), which is collected and dried over anhydrous $MgSO_4$. Solvent is removed via rotary evaporation to yield Compound 1 (12.1 g, 89%) as a yellow liquid. $^1H$ NMR: δ (ppm) 7.42 (1H, s), 6.42 (1H, d), 6.38 (1H; d), 5.13 (2, H, q), 4.37 (1H, q), 1.79 (1H, d); $^{13}C$ {H} NMR 169.9, 148.7, 143.5, 111.7, 110.7, 59.3, 39.6, 21.6.

EXAMPLE 4

Synthesis of Furyl S-thiobenzoyl-2-thiopropionate (Compound 2) of Scheme S2

Compound 1 and a stir bar are loaded into a 100 mL schlenk flask which is vacuum/backfilled three times with $N_2$. THF (20 mL) is added and the reaction is stirred. In a 25 mL round bottom flask, a stir bar is loaded and then vacuum/backfilled three times with $N_2$. Phenyl magnesium chloride (12.8 mL, 25.7 mmol) and THF (10 mL) are then added. The 25 mL round bottom flask is cooled to −78° C., and while stirring $CS_2$ (1.50 mL, 25.7 mmol) is added. The reaction stirred for 15 min at −78° C. and then for 1 h at room temperature. The contents of the round bottom flask are then transferred to the 100 mL schlenk flask via cannula, and the reaction stirred for 5 h at RT. The reaction mixture is partitioned after the addition of $H_2O$ (75 mL). The aqueous layer is then extracted with EtOAc (2×50 mL), and the organic layers are combined and dried over anhydrous $MgSO_4$. Solvent is removed via rotary evaporation to yield polymer 2 (6.31 g, 96%) as a red liquid. $^1H$ NMR: δ (ppm) 7.94 (1H, d), 7.55 (2H, t) 7.42 (1H, s), 7.39 (2H, t), 6.42 (1H, d), 6.38 (1H, d), 5.13 (2H, s), 4.75 (1H, q), 1.79 (3H, d); $^{13}C$ {$^1H$} NMR 225.5, 170.9, 149.0, 144.5, 143.5, 132.8, 128.9, 127.0, 111.7, 110.7; 59.3, 48.7, 17.4.

EXAMPLE 5

Synthesis of α-methoxy-ω-maleimido poly(ethylene glycol) (Polymer 1)

Poly(ethylene glycol) (550 g/mol; PDI<1.05) (5.00 g, 9.10 mmol), $Et_3N$ (1.68 mL, 12.0 mmol), $CH_2Cl_2$ (80 mL), and a stir bar is placed into a 250 mL flat bottom flask and cooled to 0° C. Methanesulfonyl chloride (0.78 mL, 10.0 mmol) is slowly added dropwise. The flask is warmed to room temperature and stirred for 4 h. Next, solid $K_2CO_3$ (2 g) and maleimide (1.16 g, 12.0 mmol) dissolved in THF (20 mL) is added. The reaction is then stirred at reflux for 12 h. The reaction is cooled to room temperature, and extracted with $CH_2Cl_2$ (3×100 mL), which is collected and dried over anhydrous $MgSO_4$. Solvent is removed via rotary evaporation to yield polymer 1 (5.45 g, 95%) as a yellow oil. $^1H$ NMR: δ (ppm) 6.55 (1H, s), 4.25 (2H, t), 3.41-3.68 (38H, m).

EXAMPLE 6

RAFT Polymerization of α-furyl-ω-S-thiobenzoyl poly(styrene) (Polymer 2)

Compound 2 (1.00 g, 3.24 mmol), AIBN (780 mg, 4.80 mmol), styrene (18.4 mL, 160 mmol), THF (40 mL), and a stir bar are added to a 100 mL round bottom flask. The reaction mixture is purged with $N_2$ for 30 min, and then heated at 70° C. for 19 h. The reaction is cooled to RT, and the polymer is isolated by precipitation into $CH_3OH$ to isolate polymer 2 (11.0 g, 67%) as a pink powder. GPC: $M_n$-4,600 g/mol (PDI-1.14).

EXAMPLE 7

Reduction of α-furyl-ω-S-thiobenzoyl poly(styrene) (Polymer 3)

Polymer 2 (10.6 g, 2.3 mmol) and a stir bar are loaded into a 250 mL flat bottom flask. THF (70 mL), EtOH (70 mL), and $NaBH_4$ (870 mg, 23 mmol) are added to the flask in that order. The reaction stirred for 20 h at RT. Solvent is removed via rotary evaporation. THF (10 mL) is added, and subsequent precipitation into $CH_3OH$ yielded polymer 3 (quantitative yield) as a white powder.

EXAMPLE 8

Diels-Alder Reaction Between Polymers 1 and 2 (1-DA-2 Copolymer)

Polymer 1 (1.3 g, 2.0 mmol), polymer 2 (0.75 g, 0.19 mmol), THF (7 mL) and a stir bar are loaded into a 15 mL round bottom flask. The reaction is stirred at 60° C. for five days. The reaction is cooled to RT and upon precipitation into $CH_3OH$ yielded 1-DA-2 copolymer (200 mg, 23%) as a white powder. To demonstrate reversibility, 1-DA-3 copolymer (100 mg, 0.022 mmol) toluene-(4 mL) and a stir bar are loaded into a 10 mL round bottom-flask. The reaction is stirred at 90° C. for 12 h. The reaction is cooled to RT and an analytic sample is isolated from precipitation into $CH_3OH$. See Figure S2 for $^1H$ NMR spectra.

EXAMPLE 9

Preparation of Furyl Ligand Passivated Au Nanoparticle Cores (Polymer 3-Au)

Polymer 3 (4.6 g, 1.0 mmol), toluene (25 mL), and a stir bar are loaded into a 100 mL round bottom flask, and stirred at reflux. Next, Au nanoparticles (81 mg, ~0.8 mmol of ligand) suspended in toluene (10 mL) are added, and the reaction proceeded to stir at reflux for 2 h. The reaction is cooled to RT, and the particles are isolated by a series of centrifugation, decanting and resuspension (5×) with THF/EtOH (3:2). Volatile materials are removed under vacuum to yield polymer 3-Au (1.3 g) as a magenta powder.

EXAMPLE 10

Passivation of Au Nanoparticle Cores with α-mercapto-ω-methoxy PEG Ligand (PEG-Au)

α-Mercapto-ω-methoxy PEG (500 mg, 0.1 mmol), toluene (8 mL), and a stir bar are loaded into a 25 mL round bottom flask, and stirred at reflux. Next, Au nanoparticle cores (10 mg, ~0.01 mmol of ligand) suspended in toluene (2 mL) are added, and the reaction proceeded to stir at reflux for 2 h. The reaction is cooled to RT, and the particle cores are isolated by a series of centrifugation, decanting and resuspension (5×) with $CH_3OH$. Volatile materials are removed under vacuum to yield PEG ligand passivated Au cores (64 mg) as a magenta powder.

EXAMPLE 11

Passivation of Au Nanoparticle Cores with α-mercapto-ω-methoxy poly(styrene)-b-PEG Ligand (PEG-p(St)-Au)

α-Mercapto-ω-methoxy poly(styrene)-b-PEG (1 g, 0.025 mmol), toluene (8 mL), and a stir bar are loaded into a 25 mL round bottom flask, and stirred at reflux. Next, Au nanoparticle cores (10 mg, ~0.01 mmol of ligand) suspended in toluene (2 mL) are added, and the reaction proceeded to stir at reflux for 2 h. The reaction is cooled to RT, and the particles are isolated by a series of centrifugation, decanting and resuspension (5×) with THF/EtOH (3:2). Volatile materials are removed under vacuum to yield PEG-b-PS-Au (750 mg) as a magenta powder.

EXAMPLE 12

Diels-Alder Reaction Between Linker (Polymer 1) and Polymer Ligand Passivated 3-Au Nanoparticle Core (1-DA-3 Au)

Polymer 1 (630 mg, 1.0 mmol), polymer 3-Au (1.3 g), THF (40 mL) and a stir bar are loaded into a 100 mL round bottom flask and stirred at 60° C. for five days. The reaction is cooled to RT, and the particles are isolated by a series of centrifugation, decanting and resuspension (5×) with tetrahydrofuran (THF)/methanol (MeOH) (1:3). Volatile materials are removed under vacuum to yield 1-DA-3 Au (0.98 g) as a magenta powder. The powder dissolved in 3 wt % THF and stored as a stock solution.

EXAMPLE 13

Polymer Matrix Containing Link-Ligand Passivity-Cores 1-DA-3 Au Preparation and Analysis Polymer films are then prepared by dissolving a PEG matrix ($M_n$—2,000 g/mol or 5,000 g/mol; polydispersity index (PDI) <1.05) in THF and adding various amounts of the 1-DA-3 Au stock solution per Example 12. Slow evaporation of solvent reduced drying defects and resulted in bulk polymer films with thicknesses ranging from 350-700 μm. The films are annealed at various temperatures and times, and subsequently characterized by contact angle measurements, atomic force microscopy, small-angle X-ray scattering (SAXS), and Rutherford backscattering (RBS) to explore the migration of the functionalized Au particles within the PEG matrix.

Figure 9:
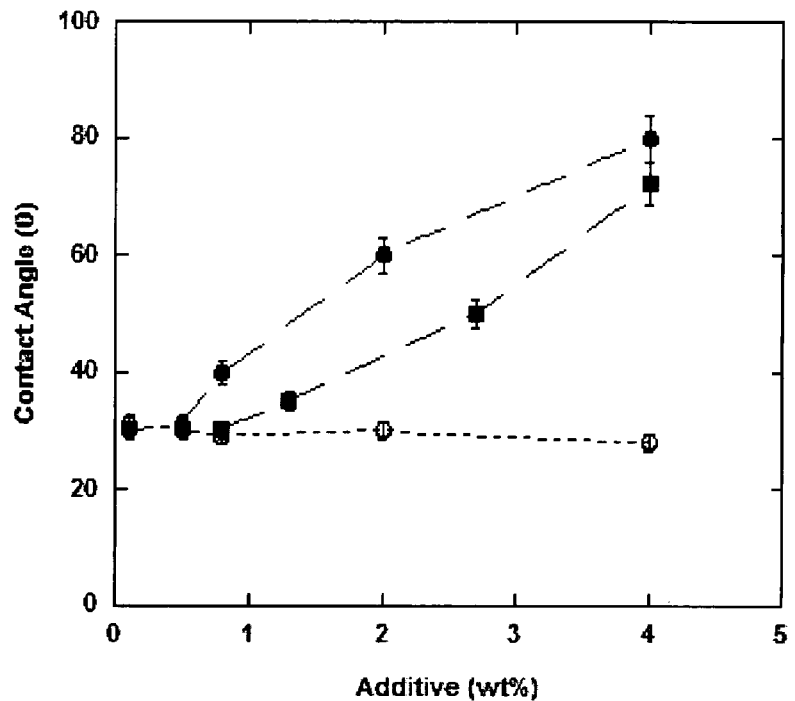
FIG. 9 is a contact angle plot for films composed of 2,000 and 5,000 g/mol polyethylene glycol (PEG) containing various wt % of 1-DA-3 Au per Formula 1 additive after annealing at 60° C. and 90° C. ○—Samples after annealing at 60° C.; ●—2,000 g/mol sample after annealing at 90° C. for 24 h; ■—5,000 g/mol sample after annealing at 90° C. for 24 h.

FIG. 9 provides contact angle data from films composed of 2,000 and 5,000 g/mol PEG containing 0.5 to 4 wt % of 1-DA-3 Au additive that are annealed at 60° C. and 90° C. for 24 hours (h). Anneal temperatures are chosen to shift the DA equilibrium towards the adduct (60° C.) or individual components (90° C.). After annealing at 60° C. for 24 h, the resulting contact angle is independent of the weight percent of additive within the matrix or the molecular weight of the PEG matrix employed and is within experimental error of pure PEG (30°±5°). Thus, the PEG shell effectively serves to compatibilize the PS-Au core from the surrounding PEG matrix. After annealing the films at 90° C. for 24 h, significant changes in the contact angle data are observed. The changes are dependent upon the wt % of additive present. At 90° C., cleavage of the DA adduct is favored and the decreased viscosity allows migration to occur. Such an increase in the contact angle indicates a reduction of surface energy most likely caused by an increase in the presence of PS at the surface of the samples. After a period of time ranging from 30 seconds to 3 minutes depending upon the wt % of additive, the contact angle decreases until the water droplet is absorbed into the PEG matrix.

Figure 10:
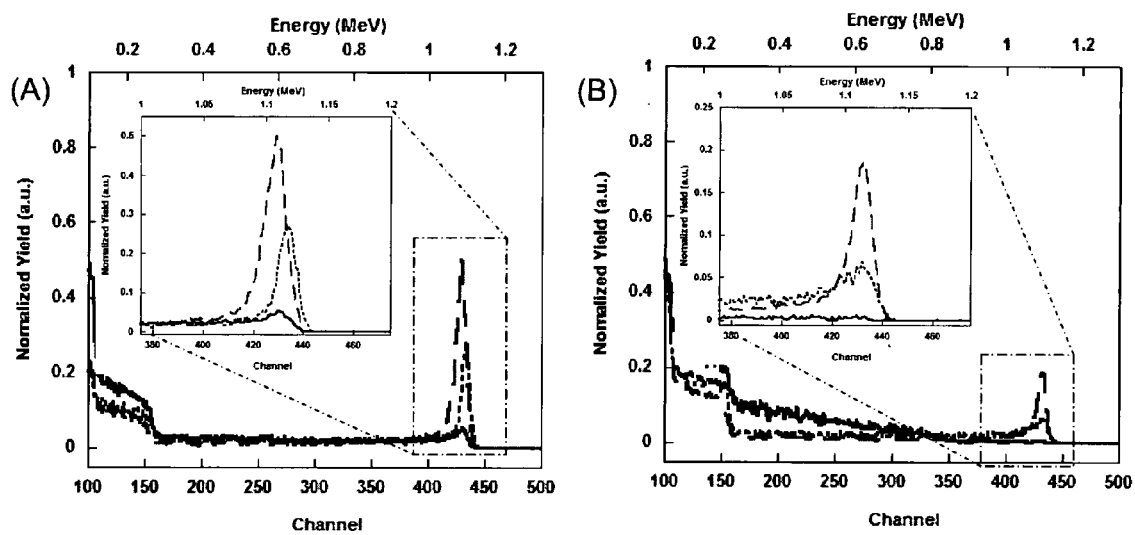
FIG. 10 is a Rutherford backscattering spectrum (RBS) for films composed of A) 2,000 g/mol; B) 5,000 g/mol PEG containing 4 wt % of 1-DA-3-Au additive after annealing at RT (solid line), 60° C. (dotted line) and 90° C. (dashed line), and expanded view of channels 475 to 375 is inset to clearly depict the increase in Au concentration at the surface of the films after annealing at 90° C.

As FIGS. 10A and 10B, RBS data from the same samples provides conclusive evidence of the migration of the Au particle cores to the matrix surface. RBS is a technique that indirectly measures the composition of a surface to a depth of approximately 2 μm. A beam of ions, typically $He^+$, is targeted towards a surface. As the ions collide with the different atomic nuclei present in the film, some ions are absorbed while others backscatter. The energy of the backscattered ions is dependent upon the both the depth and mass of the atomic nuclei. For example, if elements of high atomic mass, such as Au, are present as the surface of a film, the backscattered energy will be very large; as the atomic mass of the element from which the backscattered ions decreases, the backscattered energy is reduced. In addition, as the nuclei are placed deeper within the film relative to the surface, the measured backscattered energy will decrease In the data presented here, channels 450 to 200, 260 to 100, 150 to 0 and 100 to 0 represent the distribution of Au, Si, O and C atoms, respectively, from the surface of the film to approximately two microns in depth. Due to overlapping signals, RBS is most effective at detecting elements of large atomic mass at the surface of a film.

FIGS. 10A and 10B indicate little to no Au cores present at the surface of the film, which indicates a random distribution of Au particles within the matrix. A more pronounced signal in the highest channels after annealing for 24 h at 60° C. indicates that some-migration of Au nanoparticles to the surface of the film occurred, and much stronger evidence for migration is observed when the films are annealed for the same time at 90° C. At 60° C., the formation of the DA adduct is favored, but exists in equilibrium with the back reaction. When the DA adduct is severed, polymer 3 is able to diffuse away into the PEG matrix. The high bulk viscosity at 60° C. retards both polymer 3 and particle migration, allowing minor phase separation. The reduced viscosity present at 90° C. reduces the likelihood of reformation of the DA adduct and also facilitates the migration of the Au particles, resulting in a much greater presence of Au at the surface of the material.

Figure 11:
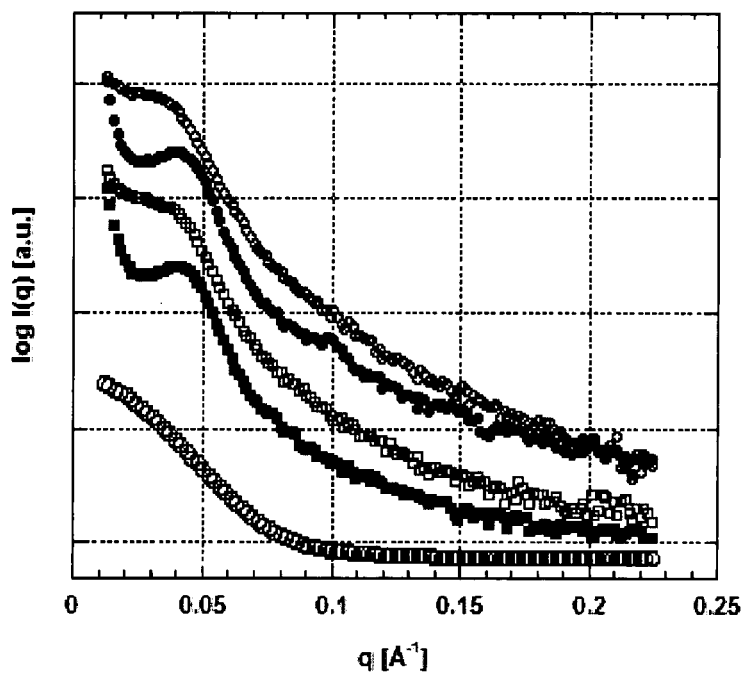
FIG. 11 is a small angle X-ray diffraction spectrum (SAXS) for olylamine-modified Au nanoparticles in solution (○), and PEG-matrix samples containing 4 wt % of 1-DA-3-Au additive. For a 2,000 g/mol PEG matrix, data are shown for a 60° C. anneal (●) and a 90° C. anneal (○). For the 5,000 g/mol PEG matrix, data are shown for a 60° C. anneal (■) and a 90° C. anneal (□), with data offset for clarity.

SAXS analysis of the samples also indicates a change in the morphology of the films with thermal stimulus. SAXS data for gold particle cores dispersed in 2,000 g/mol PEG, and gold particles dispersed in 5,000 g/mol PEG are presented in FIG. 11. The SAXS data collected for gold nanoparticle cores modified with oleylamine and dispersed in toluene are also presented for comparison. Annealing either sample at 60° C. for 24 h results in a morphology in which the particles are not only not scattering independently, but may be giving rise to core-core interactive Bragg-like diffraction peaks. In particular, the 2,000 g/mol matrix material shows two clear peaks, one at $q=0.040$ Å$^{-1}$, and one at $q=0.1$ (Å$^{-1}$). The relationship between the features is not readily apparent, but fitting form factor scattering model data to the experimental data clearly shows the higher-angle reflection is not a higher-order reflection from the Au particle form factor. The 5,000 g/mol matrix material does not show a second order reflection, but the primary peak is virtually identical to that for the 2,000 g/mol matrix sample. SAXS analysis after annealing the films for 24 h at 90° C. shows a clear change in bulk morphology to a primary peak shape from dispersed scattering centers with minor interparticle scattering effects.

EXAMPLE 14

Verification of Temperature-Sensitive Diels-Alder Bond Association with Core Migration 5 wt % of α-mercapto-ω-furyl PS (polymer 3) is dispersed within a 5,000 g/mol PEG matrix. Contact angle measurements on the corresponding films after annealing at 60° C. and 90° C. yield results of 58°±2°, indicating that for both annealing temperatures, the PS phase separates to the air interface to reduce surface energy, resulting in a larger contact angle measurement than that of pure PEG.

Au nanoparticle cores are functionalized with two different mercapto terminated polymers, α-mercapto-ω-methoxy PEG ($M_n$-5,000 g/mol; PDI<1.05) and a α-mercapto-ω-methoxy PS-b-PEG ($M_n$-40,000 g/mol; PDI-1.22; 88 wt % styrene), respectively. The functionalized Au nanoparticle cores are dispersed at 5 wt % in a 5,000 g/mol PEG matrix. Contact angle measurements of the films after annealing at 60° C. and 90° C. produced results (28°±6°) that are nearly identical to those obtained for pure PEG (29°±4°).

Figure 12:
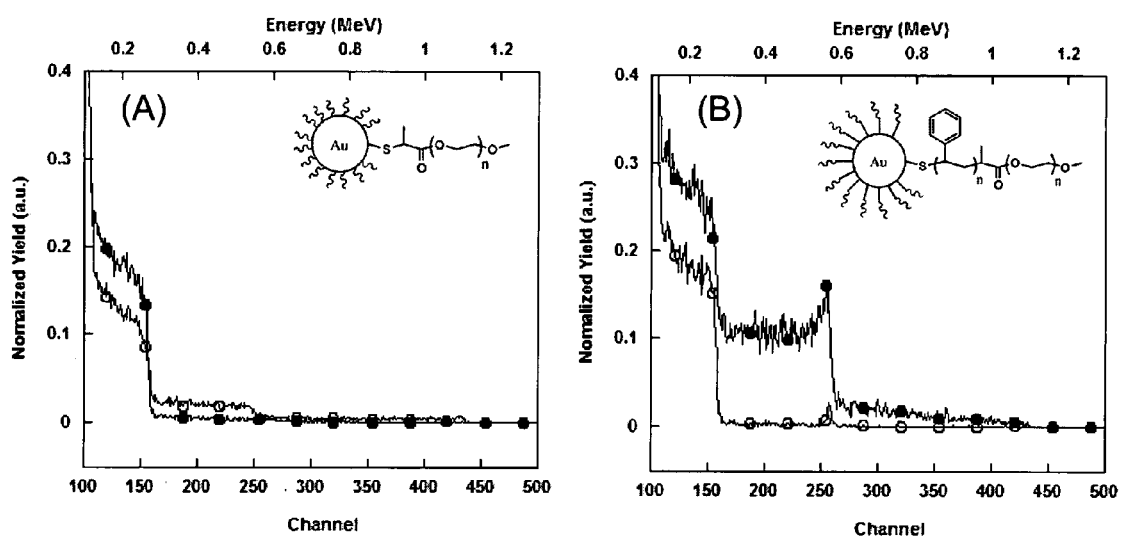
FIG. 12 is a RBS for films comprised of 5,000 g/mol PEG containing 5 wt % of A) PEG passivating 10 nm Au nanoparticle (PEG-Au); B) PEG-b-polystyrene passivated 10 nm Au nanoparticle (PEG-b-PS-Au) after annealing at 60° C. (○) and 90° C. (●), demonstrating the uniform distribution of Au nanoparticles throughout the film, free $\alpha$-mercapto-$\omega$-methoxy PS-b-PEG block copolymer creates a sulfur signal at channel 250 in FIG. 11B.

In FIG. 12, RBS experiments show no evidence of migration of nanoparticle Au cores to the surface, indicating that the PS is needed to drive the Au particles to the surface. Similarly, in FIG. 12, no migration of Au core to the surface after annealing at 60° C. and 90° C. is seen, indicating that the thermally reversible DA bond is required to expose the PS to the PEG matrix. Observation of a peak corresponding to sulfur nuclei (near channel 250) is due to free α-mercapto-ω-methoxy PS-b-PEG block copolymer.

These control experiments indicate three concepts. First, PS phase separates to the air interface when dispersed within a PEG matrix to reduce surface energy. Modifying PEG with polymer 3 resulted in a rapid change in surface energy as the PS segregated to the sample surfaces. Second, PS is needed to induce migration of the Au particle cores. As the RBS data show, without PS, the gold particle cores do not accumulate at the surface after annealing. Third, the DA bond between the blocks is necessary to expose the PS-Au core to the PEG matrix. Modifying gold particles with the α-mercapto-ω-methoxy PS-b-PEG block copolymer also does not result in any change in surface morphology with annealing.

EXAMPLE 15

Control of Core Migration Process

By changing the molecular weight of the PEG matrix, the speed at which the particles migrate to the surface is altered. Annealing the 2,000 g/mol PEG films containing 1-DA-3 Au additive for 24 h resulted in layer of Au that is approximately 35 nm thick, whereas annealing 5,000 g/mol PEG films containing 1-DA-3 at the same loading for 24 h Au additive resulted in a layer of Au approximately 15 nm thick. The lower molecular weight matrix provides fewer chain entanglements and lower bulk viscosity, thus allowing greater mobility of the functionalized nanoparticle core through the matrix. To further demonstrate this point, an annealing time study is conducted to determine the rate at which functionalized particles migrated through the PEG matrix.

Figure 13:
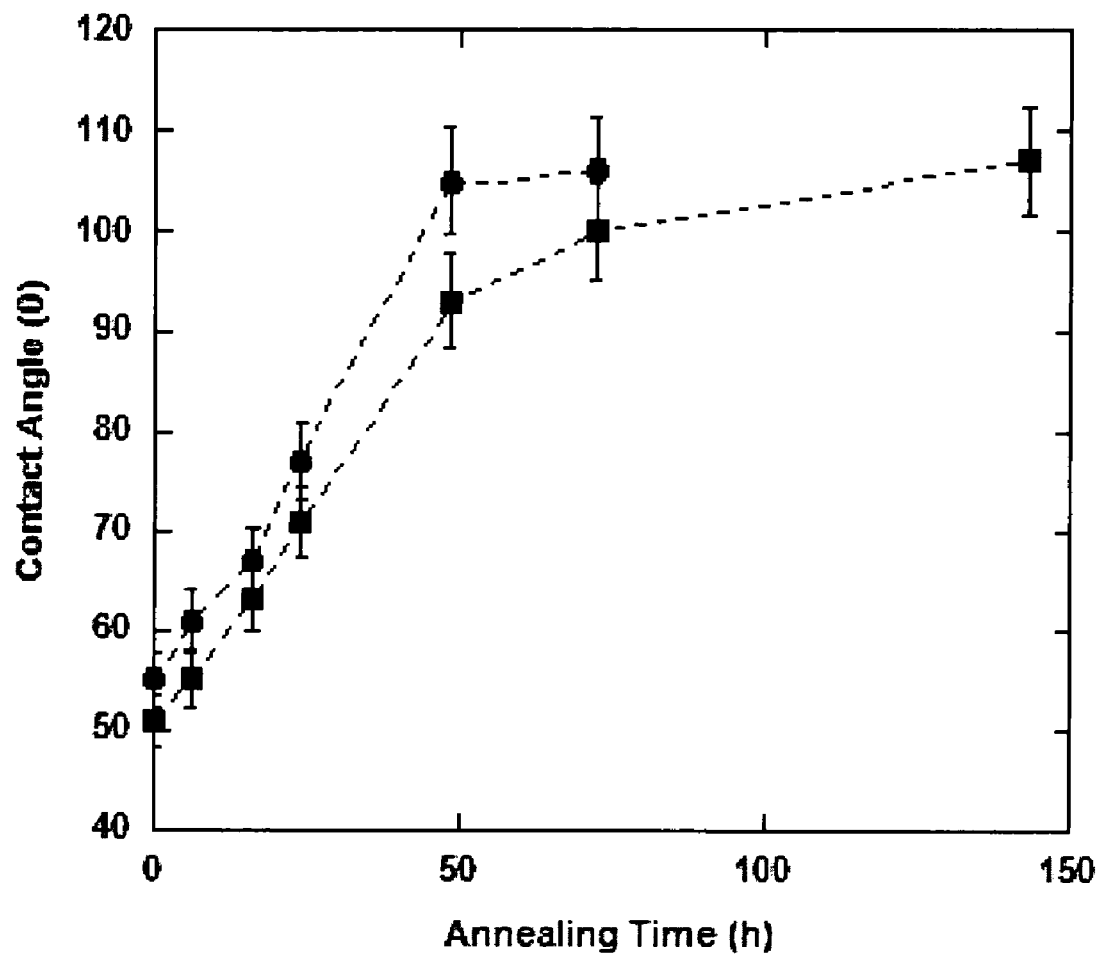
FIG. 13 is a contact angle plot for films comprised of 2,000 g/mol (●) and 5,000 g/mol (■) PEG containing 8 wt % of 1-DA-3-Au additive after annealing at 90° C.

FIG. 13 displays contact angle measurements for films of 2,000 and 5,000 g/mol PEG containing 8 wt % 1-DA-3 Au additive after annealing at 90° C. for various lengths of time. Contact angle measurements after annealing at 60° C. are displayed at 0 h. In this case a slightly higher loading of additive is used to shorten the overall experiment duration. As previously described, after annealing at 60° C., initial contact angle measurements are higher than pure PEG indicating some migration of functionalized Au particle cores to the surface.

Figure 14:
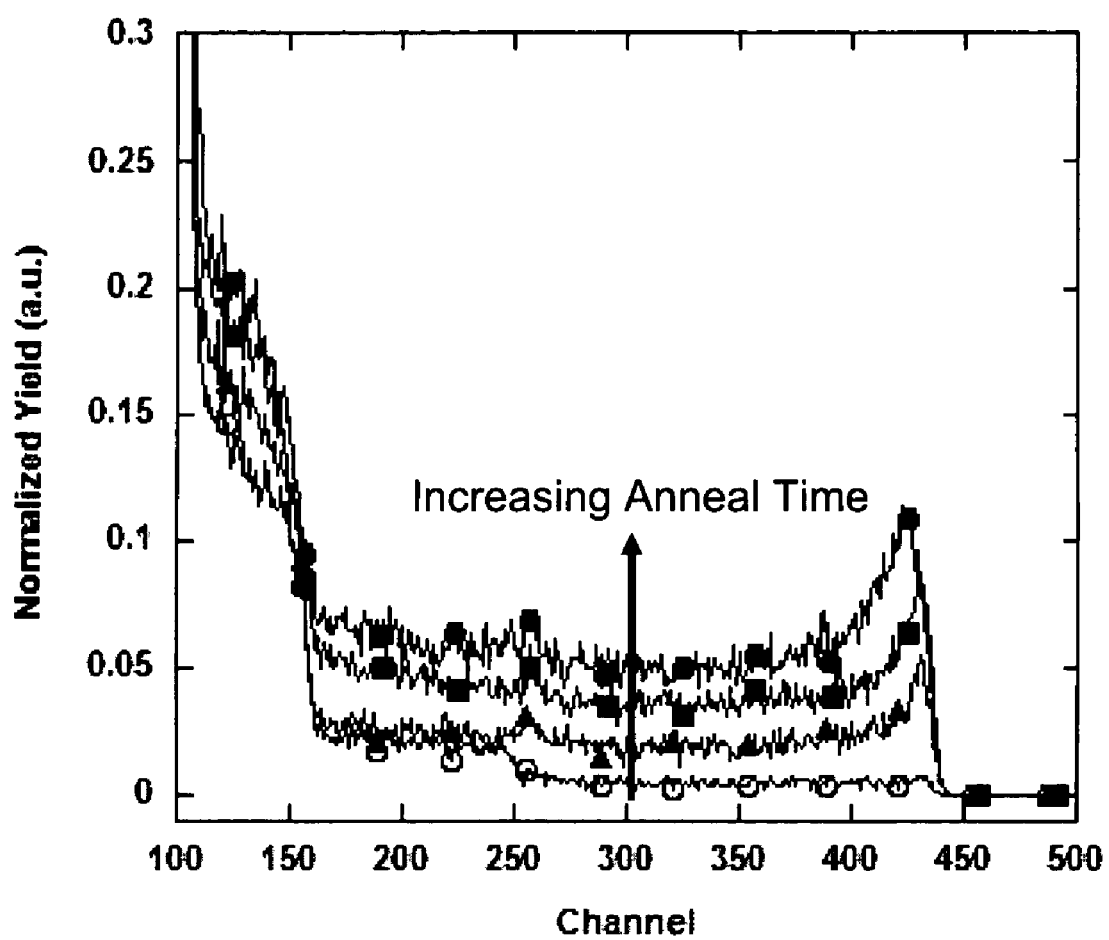
FIG. 14 is a RBS for films composed of 5,000 g/mol PEG containing 8 wt % of 1-DA-3-Au additive after annealing at 90° C. for 0 h (○), 6 h (▲), 16 h (■) and 24 h (●) displaying an increase in the concentration of Au at the surface of the films.

Increasing the anneal time results in an increase in the contact angle and thus a decrease in surface energy. RBS analysis of the 5,000 g/mol PEG film containing 8 wt % 1-DA-3 Au additive at various times also shows the increased concentration of Au at the surface with longer annealing time, FIG. 14.

EXAMPLE 16

Polymer Matrix Surface Morphology with Core Migration

Figure 15:
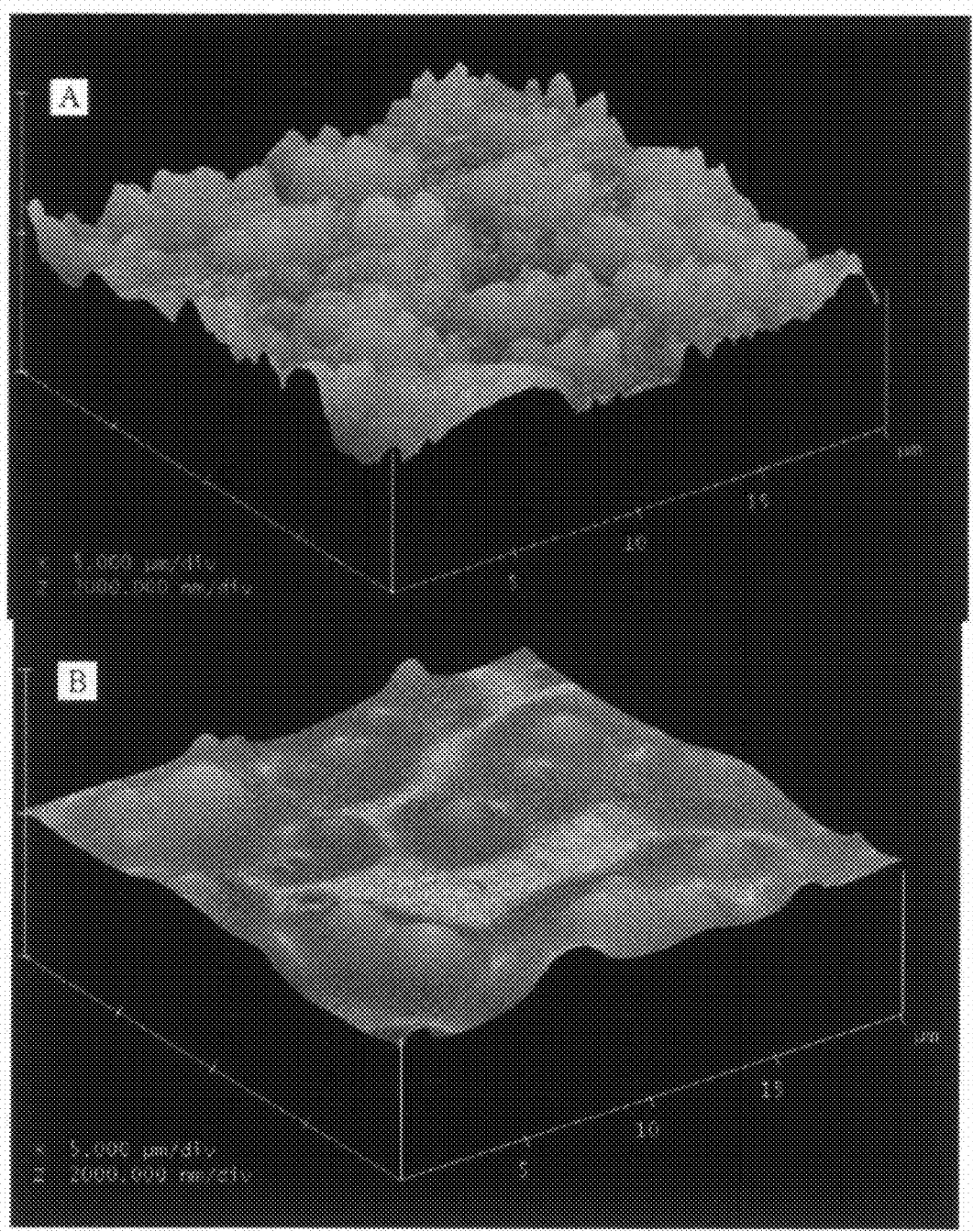
FIG. 15 is three-dimensional atomic force microscopy images of films comprised of 2,000 g/mol PEG containing 4 wt % of 1-DA-3-Au additive after annealing at 90° C. for 6 h (A) and 72 h (B)

Atomic force microscopy (AFM) is employed to explore the surface morphology. FIG. 15 displays typical 3-dimensional AFM images of films comprised 2,000 g/mol PEG containing 4 wt % of 1-DA-3 Au additive that are annealed at 90° C. for 6 h and 72 h. Analysis of the film annealed for 6 h yielded a surface roughness of 367 nm with a maximum height of 2.14 μm, whereas the film annealed for 72 h had a surface roughness of 137 nm with a maximum height of 847 nm. Typically, an increase in surface roughness increases the surface energy of the film and raises the corresponding contact angle measurement; however, these films exhibited the same contact angle regardless of the surface roughness. The main difference between these films is the rate at which a $H_2O$ droplet is absorbed into the film. Longer anneal times increase the concentration of PS-functionalized Au nanoparticle core at the surface of the film, as supported by RBS analysis (FIG. 14), and result in a more continuous film of PS which decreases the surface roughness. The continuous PS surface impedes the penetration of $H_2O$ into the underlying PEG matrix and retards the surface rearrangement process.

EXAMPLE 17

Block Copolymer Matrix Modification

Polymer films are then prepared by dissolving a PS-b-PMMA block copolymer in $CH_2Cl_2$ and adding a stock solution of 1-DA-3-Au to yield various wt % loading. Slow evaporation of solvent reduced drying defects and resulted in bulk polymer films with thicknesses ranging from 175-300 μm. Additionally, these conditions allowed for phase separation to occur. Samples are subsequently stained with $OsO_4$ resulting in dark regions representing the PS domains and light regions representing the PMMA domains. The films are annealed at 120° C. for 24 h, and subsequently characterized by cross-sectional TEM and SAXS to explore the migration of the functionalized Au particles within the PS-b-PMMA block copolymer matrix.

Figure 16A:
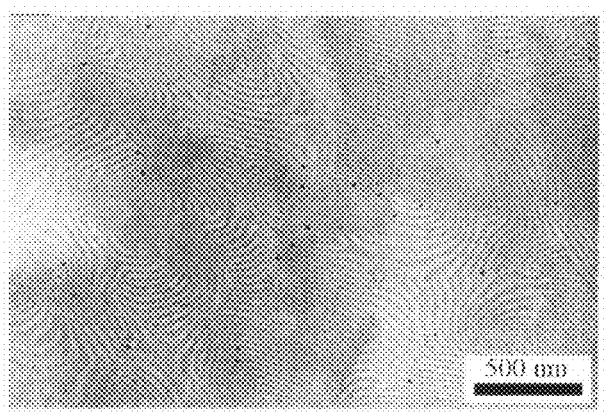
FIG. 16 is cross-sectional TEM micrographs of a PS-b-PMMA block copolymer ($M_w$ 38k-b-37k, PDI<1.05) with 5 wt % of DA functionalized Au nanoparticle additive after A) RT film formation; B) annealing at 120° C. for 24 h.
Figure 16B:
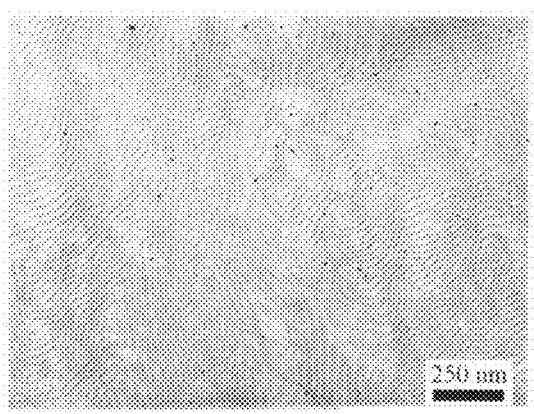

FIG. 16 shows cross-sectional TEM micrographs of the PS-b-PMMA block copolymer ($M_w$ 38k-b-37k; PDI<1.05) with 5 wt % of DA functionalized-Au nanoparticle additive after A) room temperature film formation and B) annealing at 120° C. for 24 h. Initial particle core location within the PMMA domains is dictated by the immiscibility of the PEG exterior within the PS domains, whose $\chi_{PEG/PS}$ value is approximately $-7.05 \times 10^{-3} + 21.3/T$, where T is provided in degrees Kelvin (43). Therefore to reduce interfacial energy, PEG functionalized particles are located within the compatibility PMMA domains.

Conversely, after thermal treatment the Au nanoparticle cores migrate to the PS domains because of the PS exterior.

Annealing the films at 120° C. for 24 h cleaves the PEG shell from the nanoparticle core exposing a PS exterior, which phase separates to reduce interfacial energy. Here, significant and efficient particle migration occurs; as the ratio of particles located in the correct phase to the incorrect phase is 46 to 10, ~82%. Additionally, a swelling of the PS domains is observed.

Figure 17:
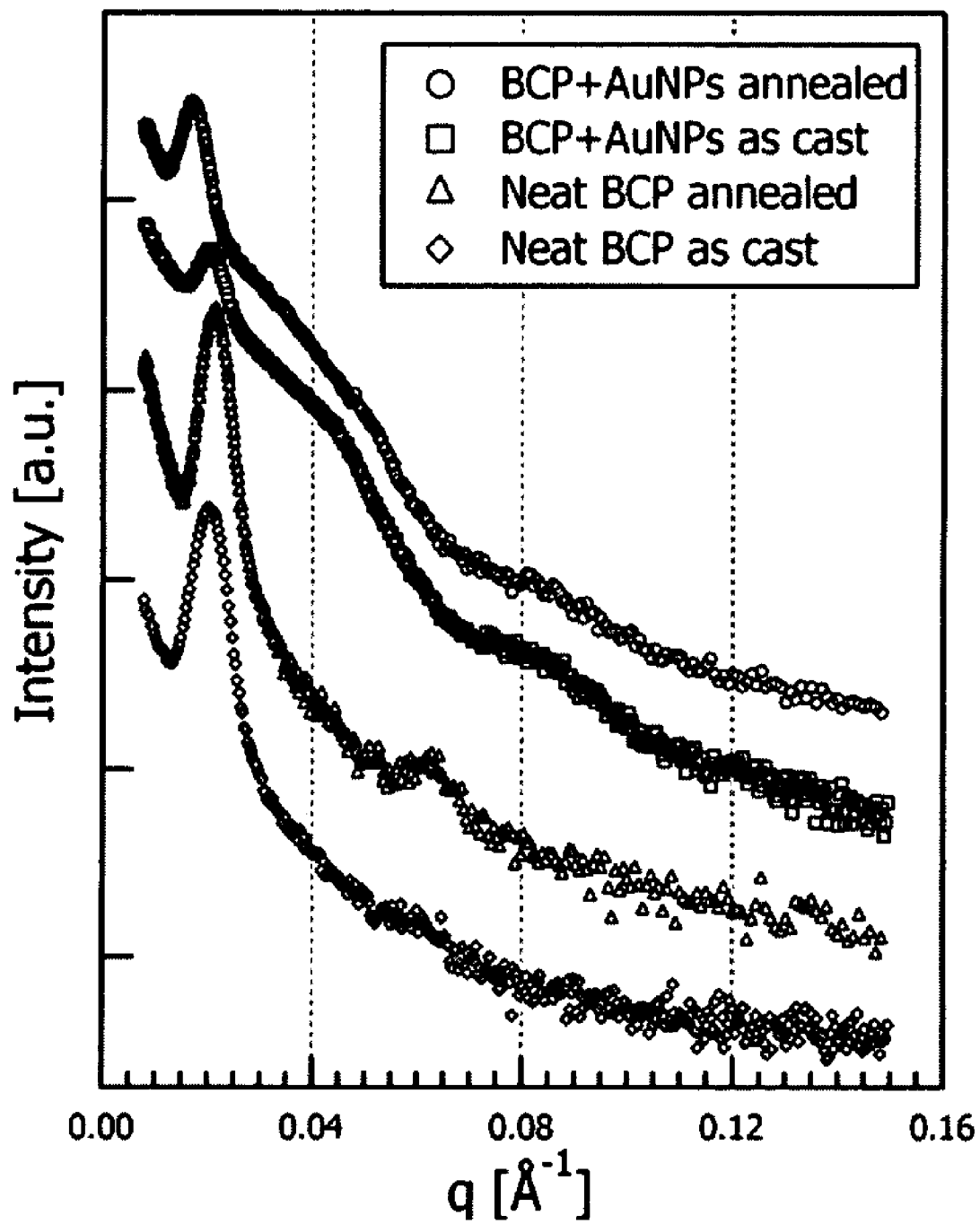
FIG. 17 is SAXS data for a PS-b-PMMA block copolymer ($M_w$ 38k-b-37k, PDI <1.05) after RT film formation (◇) and 120° C. anneal for 24 h (△. Data for PS-b-PMMA block copolymer with 5 wt % of DA functionalized Au nanoparticle additive after RT film formation (□) and 120° C. anneal for 24 h (○). Note: Data have been offset for clarity.

FIG. 17 displays SAXS data showing the change in lamellar domain spacing after annealing and Au core rearrangement. As a significant number of passivated Au nanoparticle cores migrate into the PS domains, the volume of the domain increases.

Analysis of the PS-b-PMMA block copolymer without any additive after room temperature film formation indicates a single Bragg peak diffraction at q=0.0201, with a domain size of 31.2 nm. Annealing the block copolymer at 120° C. for 24 h results in a sharpening of that Bragg peak to a domain size of 29.4 nm and the appearance of a second Bragg reflection at q=0.0608, indicating increased long-range order typical of an annealed block copolymer sample. For a lamellar morphology, Bragg reflections occur at integer multiples of the primary scattering vector (i.e. q*, 2q*, 3q*, etc.) and that alternating lamellae of equal thicknesses result in a systematic absence of the even Bragg reflections. Thus, the SAXS data in FIG. 17 confirm the lamellar morphology of the PS-b-PMMA block copolymer both neat and after the addition of the Au nanoparticle cores. Analysis of the PS-b-PMMA block copolymer containing the DA functionalized Au nanoparticle cores generated from room temperature film formation displays a Bragg peak corresponding to a domain size of 31.3 nm, which is in good agreement with the block copolymer without the additive after room temperature film formation. Scattering from the individual Au nanoparticle cores is also evident. Annealing the same sample at 120° C. for 24 h displays a significant shift to a domain size of 37.6 nm, which is in agreement with the TEM micrographs.

EXAMPLE 18

Effect of Polymer Matrix Domain Size

Figure 18:
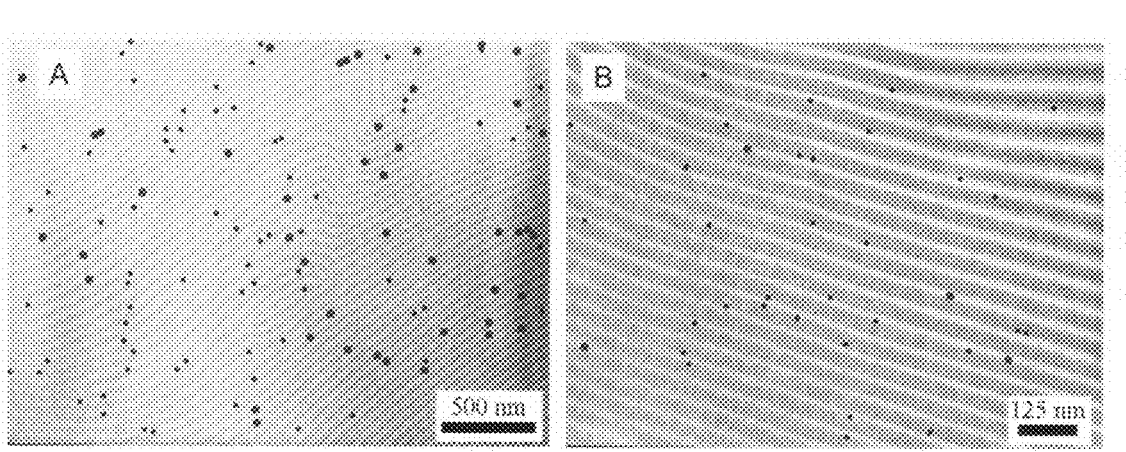
FIG. 18 is cross-sectional TEM micrographs of a PS-b-PMMA block copolymer ($M_w$ 170k-b-168k, PDI<1.05) with 5 wt % of DA functionalized Au nanoparticle additive after A) RT film formation; B) annealing at 120° C. for 24 h. Key: Small •—correct phase. Large ●—incorrect phase.

FIG. 18 depicts cross-sectional TEM micrographs of the PS-b-PMMA block copolymer ($M_w$ 170k-b-168k; PDI<1.05) with 5 wt % of DA functionalized Au nanoparticle additive after A) room temperature film formation and B) annealing at 120° C. for 24 h. After room temperature film formation, a modest improvement is observed in reference to the initial particle location as the ratio of particles located in the correct phase to the incorrect phase is 20 to 17, ~54%. Increasing the domain size to $M_w$ 90k-b-90k reduced the conformational energy requirement needed to include the particles within the miscible polymer domain as compared to the 38k-b-37k copolymer shown in FIG. 16. Annealing the films at 120° C. for 24 h results in significant and efficient particle migration to occur as the ratio of particles located in the correct phase to the incorrect phase is 22 to 3, ~88%.

A third block PS-b-PMMA block copolymer with a domain size of approximately 110 nm was utilized as a matrix. FIG. 18 depicts cross-sectional TEM micrographs of the PS-b-PMMA block copolymer ($M_w$ 170k-b-168k; PDI<1.05) with 5 wt % of DA passivated Au nanoparticle cores after A) room temperature film formation and B) annealing at 120° C. for 24 h. After room temperature film formation, the passivated nanoparticle cores are homogenously dispersed within the PS-b-PMMA block copolymer and exhibit a significant improvement upon initial particle location as the ratio of particles located in the correct phase to the incorrect phase is 73 to 45, ~62%. Again, increasing the domain size provided control on the initial particle location. Annealing the films at 120° C. for 24 h results in significant and efficient particle migration to occur as the ratio of particles located in the correct phase to the incorrect phase is 32 to 4, ~90%. As previously observed, a swelling of the PS domains occurs due to the inclusion of functionalized Au nanoparticles within the PS domains.

Increasing the molecular weight of the block copolymer improves the dispersability of the passivated nanoparticle cores within the polymer domains.

EXAMPLE 19

Core Migration Controlled by $\chi_{LIG^*}$

Figure 19:
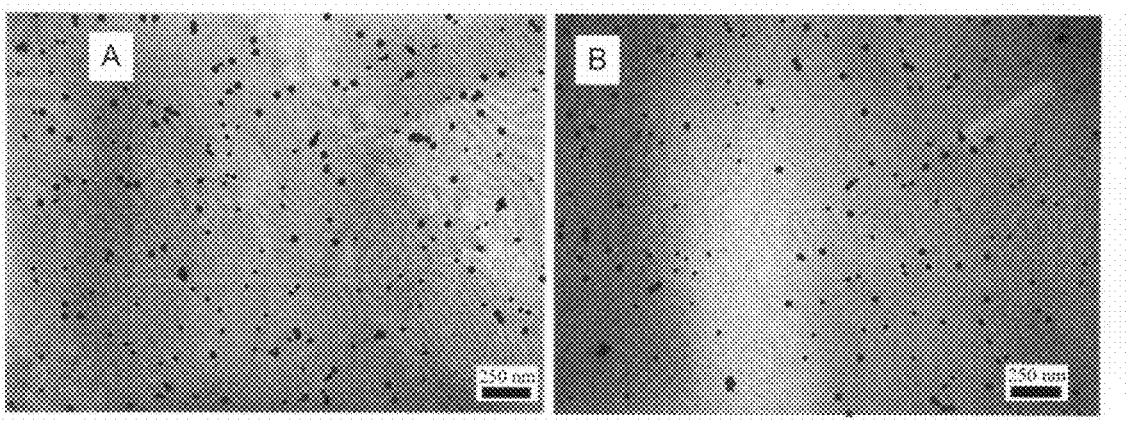
FIG. 19 is cross-sectional TEM micrographs of a PS-b-PMMA block copolymer ($M_w$ 38k-b-37k, PDI<1.05) with 7 wt % of PEG functionalized Au nanoparticle additive after A) RT film formation; B) annealing at 120° C. for 24 h. Key: Small •—correct phase. Large ●—incorrect phase.
Figure 20:
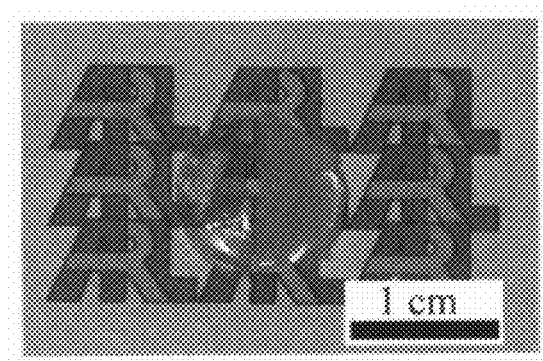
FIG. 20 is an optical micrograph of a core loaded polymer that is transparent at 20° C. and opaque after anneal.

Au nanoparticle cores are passivated with α-methoxy-ω-mercapto PEG polymers to direct alignment within the PMMA domains regardless of the processing conditions. FIG. 19 depicts cross-section TEM micrographs of the PS-b-PMMA block copolymer ($M_w$ 38k-b-37k, PDI<1.05) with 7 wt % of DA passivated Au nanoparticle cores after A) room temperature film formation and B) annealing at 120° C. for 24 h. Again, after room temperature film formation, a homogenous dispersion of particles within the PS-b-PMMA block copolymer is observed. An improvement is observed for initial selectivity as the ratio of particles located in the correct phase to the incorrect phase is 123 to 111, ~53%. The larger molecular weight of α-methoxy-ω-mercapto PEG ligands compared to the PEG shell employed for the DA passivated Au nanoparticle cores, 5,000 g/mol vs. 630 g/mol, respectively, increases phase separation.

REFERENCES CITED

1. Xu, F. J.; Zhong, S. P.; Yung, L. Y. L.; Neoh, K. G. *Biomacromolecules* 2004, 5, 2392-2403.
2. Okajima, S.; Sakai, Y.; Yamaguchi, T. *Langmuir* 2005, 21, 4043-4049.
3. Csetneki, I.; Filipcsei, G.; Zrinyi, M. *Macromolecules* 2006, 39, 1939-1942.
4. McElhanon, H. R.; Russick, E. M.; Wheeler, D. R.; Low, D. A.; Aubert, J. H. *J. Appl. Poly. Sci.* 2002, 85, 1496-1502.
5. Gonzalez-Leon, J. A.; ky, S.-W.; Hewlett, S. H.; Ibrahim, S. H.; Mayes, A. M. *Macromolecules* 2005, 38, 8036-8044.
6. Avella, M.; Errico, M. E.; Martuscelli, E. *Nano Lett.* 2001, 1, 213-217.
7. Ash, B. J.; Siegel, R. W.; Schadler, L. S. *Macromolecules* 2004, 37, 1358-1369.
8. Sumita, M.; Tsukihi, H.; Miyasaka, K.; Ishikawa, K. *J. Appl. Polym. Sci.* 1984, 29, 1523-1530.
9. Ou, Y.; Yang, F.; Yu, Z.-Z. *J. Polym. Sci., Part B: Polym. Phys.* 1998, 36, 789-795.
10. Petrovic, Z. S.; Shange, W. *Mater. Sci. Furum* 2000 352, 171-176.
11. Schultz, A. J.; Hall, C. K.; Genzer, J. *Macromolecules* 2005, 38, 3007-3016.
12. Huh, J.; Ginzburg, V. V.; Balazs, A. C. *Macromolecules* 2000, 33, 8085-8096.

13. Thompson, R. B; Ginzburg, V. Y.; Matsen, M. W.; Balazs, A. C. *Science* 2001, 292, 2469-2472.
14. Thompson, R. B.; Jasnow, D.; Matsen, M. W.; Balazs, A. C. *Macromolecules* 2002, 35, 1060-1071.
15. Elman, J. F.; Johs, B. D.; Long, T. E.;. Koberstein, J. T. *Macromolecules* 1994, 27, 5341.
16. Bhatia, Q. S.; Pan, D. H.; Koberstein, J. T. *Macromolecules* 1988, 21, 2166-2175.
17. Pan, D. H.; Prest, W. M. J. *J. Appl. Phys.* 1985, 58, 2861.
18. Schmitt, R.; Gardella, J. A.; Magill, J. H.; Salvat, L. *Macromolecules* 1985, 18, 2675-2679.
19. Wu, S. *Polymer Interfaces and Adhesion*; Marcel Dekker: New York, 1982; Vol. 1st ed.
20. Gaines, G. L. *J. Chem. Phys.* 1969, 73, 3143.
21. Hunt, M. O. J.; Belu, A. M.; Linton, R. W.; DeSimone, J. M. *Macromolecules* 1993, 26, 4845-4853.
22. Affrossman, S.; Hartshorne, M.; Kiff, T.; Pethrick, R. A.; Richards, R. W. *Macromolecules* 1994, 27, 1588-1591.
23. Hopkinson, I.; Kiff, F. T.; Richards, R. W.; Bucknall, D. G.; Clough, A. S. *Polymer* 1997, 38, 87.
24. Schaub, T. F.; Kellogg, G. J.; Mayes, A. M.; Kulasekere, R.; Anker, J. F.; Kaiser, H. *Macromolecules* 1996, 29, 3982-3990.
25. Yuan, C.; Ouyang, M.; Koberstein, J. T. *Macromolecules* 1999, 32, 2329-2333.
26. Mason, R.; Jalbert, C. J.; O'Rourke-Muisener, P. A. V.; Koberstein, J. T. *Adv. Colloid Interface Sci.* 2001, 94, 1.
27. Jalbeit, C. A.; Koberstein, J. T.; Hariharan, A.; Kumar, S. *Macromolecules* 1997, 30, 4481-4490.
28. O'Rourke-Muisener, P. A. V.; Koberstein, J. T.; Kumar, S. *Macromolecules* 2003, 36, 771-781.
29. O'Rourke-Muisener, P. A. V.; Jalber, C. A.; Yuan, C.; Baetzold, J.; Mason, R.; Wong, D.; Kim, Y. J.; Koberstein, J. T. *Macromolecules* 2003, 36, 2956-2966.
30. Chiu, J. J.; Kim, B. J.; Kramer, E. J.; Pine, D. J. *J. Am. Chem. Soc.* 2005, 127, 5036-5037.
31. Kim, B. J.; Bang, J.; Hawker, C. J.; Kramer, E. J. *Macromolecules* 2006, 39, 4108-4114.
32. Fringuelli, F.; Taticchi, A. *Dienes in the Diels-Alder Reaction*; John Wiley & Sons: New York, 1990.
33. Carruthers, W. *Cycloaddition Reactions in Organic Synthesis* Oxford, U.K., 1990.
34. Flory, P. J. *Principles of Polymer Chemistry,* 1953, Cornell University Press (ISBN 0801401348).
35. Odian, G. *Principles of Polymerization* 4$^{th}$ edition, 2004, John Wiley & Sons (ISBN 9780471274001).
36. Zhu, L.; Cheng, S. Z. D.; Calhoun, B. H.; Qe, Q.; Quirk, R. P.; Thomas, E. L.; Hsiao, B. S.;Yeh, F.; Lotz, B. *Polymer* 2001, 42, 5829-5839.
37. Sato, T.; Katayama, K.; Suzuki, T.; Shiomi, T. *Polymer* 1998, 39, 773-780.
38. Sato, T., Endo, M., Shiomi, T. Imai, K. *Polymer* 1996, 37, 2131.
39. Shiomi, T. Karasz, F. E. MacKnight, W. J. *Macromolecules* 1986, 19, 2644.
40. Brannock, G. R., Barlow, J. W., Paul, D. R. *Journal of Polymer Science, Polymer Physics Edition.* 1991, 29, 413.
41. Cimmino; S., Karasz, F. E., MacKnight, W. J., *Journal of Polymer Science, Polymer Physics Edition.* 1992, 30, 49.
42. Cowie, J. M. G., Reid, V. M. C., McEwen, I. J. *Polymer* 1990, 31, 905;
43. Lowe, A. B.; Sumerlin, B. S.; Donovan, M. S.; McCormick, C. L. *J. Am. Chem. Soc.* 2002, 124, 11562-11563.
44. Hiramatsu, H.; Osterloh, F. E. *Chem. Mater.* 2004, 16, 2509-2511.
45. Zhu L.; Cheng, S. Z. D.; Calhoun, B. H.; Ge, Q.; Quirk, R. P.; Thomas, E. L.; Hsiao, B. S.; Yeh, F.; Lotz, B. *Polymer* 2001, 42, 5829-5839.
46. Park, J. O.; Jang, S. H. *J. Polym. Sci. Part A. Poly. Chem.* 1992, 30, 723-729.

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

The invention claimed is:

1. A composition comprising:
   a polymer matrix;
   a core having a core surface embedded in said polymer matrix;
   a polymeric ligand passivating the core surface and having a moiety Y, where Y is a first Diels-Alder group selected from the group consisting of: a diene and a dienophile; and
   a polymeric linker having a second Diels-Alder group complementary to the first Diels-Alder group and forming a Diels-Alder bond with the moiety Y.

2. The composition of claim 1 wherein said polymeric ligand has ligand-matrix Flory-Huggins binary interaction function $\chi_{LIG}$ greater than 0 and said linker has a linker-matrix Flory-Huggins binary interaction function $\chi_{LINK}$ less than −0.01.

3. The composition of claim 1 wherein said Diels-Alder bond is dissociated with application of a thermal stimulus to said polymer matrix.

4. The composition of claim 1 wherein said core further comprises a surface modifying species bonded to said core, said surface modifying species being selected from the group consisting of: a chromophore, a protein, an antibody, a saccharide, and a nanoparticle core, and a nanowire core.

5. The composition of claim 1 further comprising a plurality of polymeric ligands passivating the core surface; and a plurality of second polymeric linkers each of said plurality of second linkers forming a Diels-Alder bond to one of said plurality of polymeric ligands.

6. The composition of claim 5 wherein each of said plurality of second linkers has a second linker-matrix Flory-Huggins binary interaction function less than 0.

7. The composition of claim 1 wherein said core is selected from the group consisting of: molecules, macromolecules, microelectromechanical system structures, and particles.

8. The composition of claim 1 wherein said core is a nanoparticle having a longest linear dimension of between 1 and 80 nanometers.

9. The composition of claim 1 wherein said polymeric ligand has the formula

 (I)

where L is independently in each occurrence a moiety reactive with a core surface site and includes $NHR^2$—, [imidazole-$R^2$], HS—, HO—, $R^3OOC$—, $C(R^2)_2$=$CR^2$—, $R^1C$=CH—HC=$CR^3$, OCN—, XOC—(X=Cl, Br, I), $R^2$=C—, $N_3$—, m is an integer 1, 2 or 3; $R^2$ is independently in each occurrence hydrogen or $C_1$-$C_4$ alkyl; $R^2$ is an electron, hydrogen, $C_1$-$C_4$ alkyl; R is a monomer with a linear backbone of $C_2$-$C_6$ alkyl,—$(R^2)Si$—O—, $C_2$-$C_6$ alkyl-Q-$C_2$-$C_6$ alkyl, $C_2$-$C_6$ glycol, $C_6$-$C_{24}$ aryl, $C_6$-$C_{24}$ cycloalkyl, ethers-, esters-, thioethers- and amides- of $C_2$-$C_{24}$ alkyl, as well as substituted forms of any of the aforementioned $R^1$ monomers where a substituent for a proton is in one or more instances $C_6$-$C_{24}$ aryl, $C_1$-$C_{24}$ alkyl, or heteroatom containing alkyl or aryl substituents where the heteroatom is present as an amine, phosphosate, thiol, alcohol, or carboxyl; Q is sulfur or oxygen; n is an integer value between 10 and 1000; Y is a Diels-Alder reactive moiety of a diene or a dienophile; and p is an integer 1, 2 or 3.

10. The composition of claim 1 wherein said linker has the formula:

  (II)

where Y' is a complementary Diels-Alder reactive moiety of a diene or a dienophile relative to Y; p is an integer 1, 2 or 3; $R^{1\prime}$ is a monomer with a linear backbone of $C_2$-$C_6$ alkyl, —$(R^2)_2$Si—O—, $C_2$-$C_6$ alkyl-Q-$C_2$-$C_6$ alkyl, $C_2$-$C_6$ glycol, $C_6$-$C_{24}$ aryl, $C_6$-$C_{24}$ cycloalkyl, ethers-, esters-, thioethers- and amides- of $C_2$-$C_{24}$ alkyl, as well as substituted forms of any of the aforementioned $R^{1\prime}$ monomers where a substituent for a proton is in one or more instances $C_6$-$C_{24}$ aryl, $C_1$-$C_{24}$ alkyl, or heteroatom containing alkyl or aryl substituents where the heteroatom is present as an amine, phosphate, thiol, alcohol, or carboxyl; Q is sulfur or oxygen; and n is an integer value between 10 and 1000.

11. A composition comprising:

a core having a core surface;

a polymeric ligand passivating the core surface, said polymeric ligand having a terminal moiety selected from the group consisting of: a diene and a dienophile;

a polymer matrix having a matrix surface, said polymer matrix defining a matrix-ligand Flory-Huggins binary interaction function greater than 0 and said core is located on the matrix surface.

12. The composition of claim 11 wherein said polymeric ligand defines a matrix-ligand Flory-Huggins binary interaction function greater than 0.01 at 20° Celsius.

13. The composition of claim 11 further comprising a second polymer matrix immiscible with said polymer matrix contiguous with the matrix surface.

14. The composition of claim 11 further comprising a plurality of said cores, each of said plurality of cores passivated with a plurality of polymeric ligands each terminating in a diene or a dienophile wherein said plurality of cores are located on the matrix surface.

15. The composition of claim 14 wherein the matrix surface is contoured and non-planar.

* * * * *